(12) United States Patent
Adest et al.

(10) Patent No.: US 8,659,188 B2
(45) Date of Patent: Feb. 25, 2014

(54) DISTRIBUTED POWER HARVESTING SYSTEMS USING DC POWER SOURCES

(71) Applicant: Solaredge Technolgies Ltd., Hod Hasharon (IL)

(72) Inventors: Meir Adest, Modiin (IL); Lior Handelsman, Givataim (IL); Yoav Galin, Ra'anana (IL); Amir Fishelov, Tel-Aviv (IL); Guy Sella, Beit-Aharon (IL); Yaron Binder, Haifa (IL)

(73) Assignee: Solaredge Technologies Ltd., Hod Hasharon (IL)

( * ) Notice: Subject to any disclaimer, the term of this patent is extended or adjusted under 35 U.S.C. 154(b) by 0 days.

(21) Appl. No.: 13/743,581

(22) Filed: Jan. 17, 2013

(65) Prior Publication Data

US 2013/0193945 A1    Aug. 1, 2013

Related U.S. Application Data

(63) Continuation of application No. 13/186,601, filed on Jul. 20, 2011, now Pat. No. 8,384,243, which is a continuation-in-part of application No. 11/950,271, filed on Dec. 4, 2007.

(60) Provisional application No. 60/916,815, filed on May 9, 2007, provisional application No. 60/908,095, filed on Mar. 26, 2007, provisional application No. 60/868,962, filed on Dec. 7, 2006, provisional application No. 60/868,851, filed on Dec. 6, 2006, provisional application No. 60/868,893, filed on Dec. 6, 2006.

(51) Int. Cl.
    *H01H 37/00* (2006.01)

(52) U.S. Cl.
    USPC .......................................... 307/117; 307/112

(58) Field of Classification Search
    USPC ............................................................ 307/117
    See application file for complete search history.

(56) References Cited

U.S. PATENT DOCUMENTS

| | | |
|---|---|---|
| 3,369,210 A | 2/1968 | Manickella |
| 3,596,229 A | 7/1971 | Hohorst |

(Continued)

FOREIGN PATENT DOCUMENTS

| | | |
|---|---|---|
| CN | 1309451 A | 8/2001 |
| DE | 19737286 A1 | 3/1999 |

(Continued)

OTHER PUBLICATIONS

QT Technical Application Papers, "ABB Circuit-Breakers for Direct current Applications", ABB SACE S.p.A., An ABB Group Coupany, L.V. Breakers, Via Baioni, 35, 24123 Bergamo-Italy, Tel.: +39 035.395.111—Telefax: +39 035.395.306-433, Sep. 2007.

(Continued)

*Primary Examiner* — Hal Kaplan
(74) *Attorney, Agent, or Firm* — Banner & Witcoff, Ltd

(57) ABSTRACT

A method for maintaining reliability of a distributed power system including a power converter having input terminals and output terminals. Input power is received at the input terminals. The input power is converted to an output power at the output terminals. A temperature is measured in or in the environment of the power converter. The power conversion of the input power to the output power may be controlled to maximize the input power by setting at the input terminals the input voltage or the input current according to predetermined criteria. One of the predetermined criteria is configured to reduce the input power based on the temperature signal responsive to the temperature. The adjustment of input power reduces the input voltage and/or input current thereby lowering the temperature of the power converter.

17 Claims, 9 Drawing Sheets

(56) References Cited

U.S. PATENT DOCUMENTS

| | | |
|---|---|---|
| 4,060,757 A | 11/1977 | McMurray |
| 4,101,816 A | 7/1978 | Shepter |
| 4,171,861 A | 10/1979 | Hohorst |
| 4,452,867 A | 6/1984 | Conforti |
| 4,460,232 A | 7/1984 | Sotolongo |
| 4,481,654 A | 11/1984 | Daniels et al. |
| 4,554,515 A | 11/1985 | Burson et al. |
| 4,598,330 A | 7/1986 | Woodworth |
| 4,623,753 A | 11/1986 | Feldman et al. |
| 4,637,677 A | 1/1987 | Barkus |
| 4,641,042 A | 2/1987 | Miyazawa |
| 4,641,079 A | 2/1987 | Kato et al. |
| 4,644,458 A | 2/1987 | Harafuji et al. |
| 4,652,770 A | 3/1987 | Kumano |
| 4,783,728 A | 11/1988 | Hoffman |
| RE33,057 E | 9/1989 | Clegg et al. |
| 4,868,379 A | 9/1989 | West |
| 4,888,063 A | 12/1989 | Powell |
| 4,888,702 A | 12/1989 | Gerken et al. |
| 4,899,269 A | 2/1990 | Rouzies |
| 4,903,851 A | 2/1990 | Slough |
| 4,987,360 A | 1/1991 | Thompson |
| 5,045,988 A | 9/1991 | Gritter et al. |
| 5,081,558 A | 1/1992 | Mahler |
| 5,191,519 A | 3/1993 | Kawakami |
| 5,280,232 A | 1/1994 | Kohl et al. |
| 5,327,071 A | 7/1994 | Frederick et al. |
| 5,345,375 A | 9/1994 | Mohan |
| 5,402,060 A | 3/1995 | Erisman |
| 5,446,645 A | 8/1995 | Shirahama et al. |
| 5,460,546 A | 10/1995 | Kunishi et al. |
| 5,493,154 A | 2/1996 | Smith et al. |
| 5,497,289 A | 3/1996 | Sugishima et al. |
| 5,517,378 A | 5/1996 | Asplund et al. |
| 5,530,335 A | 6/1996 | Decker et al. |
| 5,548,504 A | 8/1996 | Takehara |
| 5,604,430 A | 2/1997 | Decker et al. |
| 5,616,913 A | 4/1997 | Litterst |
| 5,644,219 A | 7/1997 | Kurokawa |
| 5,646,501 A | 7/1997 | Fishman et al. |
| 5,659,465 A | 8/1997 | Flack et al. |
| 5,686,766 A | 11/1997 | Tamechika |
| 5,773,963 A | 6/1998 | Blanc et al. |
| 5,777,515 A | 7/1998 | Kimura |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,886,890 A | 3/1999 | Ishida et al. |
| 5,892,354 A | 4/1999 | Nagao et al. |
| 5,905,645 A | 5/1999 | Cross |
| 5,919,314 A | 7/1999 | Kim |
| 5,923,158 A | 7/1999 | Kurokami et al. |
| 5,932,994 A | 8/1999 | Jo et al. |
| 5,933,327 A | 8/1999 | Leighton et al. |
| 5,945,806 A | 8/1999 | Faulk |
| 5,949,668 A | 9/1999 | Schweighofer |
| 5,963,010 A | 10/1999 | Hayashi et al. |
| 5,990,659 A | 11/1999 | Frannhagen |
| 6,031,736 A | 2/2000 | Takehara et al. |
| 6,038,148 A | 3/2000 | Farrington et al. |
| 6,046,919 A | 4/2000 | Madenokouji et al. |
| 6,050,779 A | 4/2000 | Nagao et al. |
| 6,078,511 A | 6/2000 | Fasullo et al. |
| 6,081,104 A | 6/2000 | Kern |
| 6,082,122 A | 7/2000 | Madenokouji et al. |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,219,623 B1 | 4/2001 | Wills |
| 6,255,360 B1 | 7/2001 | Domschke et al. |
| 6,256,234 B1 | 7/2001 | Keeth et al. |
| 6,259,234 B1 | 7/2001 | Perol |
| 6,262,558 B1 | 7/2001 | Weinberg |
| 6,285,572 B1 | 9/2001 | Onizuka et al. |
| 6,301,128 B1 | 10/2001 | Jang et al. |
| 6,304,065 B1 | 10/2001 | Wittenbreder |
| 6,320,769 B2 | 11/2001 | Kurokami et al. |
| 6,339,538 B1 | 1/2002 | Handleman |
| 6,351,130 B1 | 2/2002 | Preiser et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,433,522 B1 | 8/2002 | Siri |
| 6,448,489 B2 | 9/2002 | Kimura et al. |
| 6,452,814 B1 | 9/2002 | Wittenbreder |
| 6,493,246 B2 | 12/2002 | Suzui et al. |
| 6,507,176 B2 | 1/2003 | Wittenbreder, Jr. |
| 6,531,848 B1 | 3/2003 | Chitsazan et al. |
| 6,545,211 B1 | 4/2003 | Mimura |
| 6,548,205 B2 | 4/2003 | Leung et al. |
| 6,590,793 B1 | 7/2003 | Nagao et al. |
| 6,593,521 B2 | 7/2003 | Kobayashi |
| 6,608,468 B2 | 8/2003 | Nagase |
| 6,611,441 B2 | 8/2003 | Kurokami et al. |
| 6,628,011 B2 | 9/2003 | Droppo et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,731,136 B2 | 5/2004 | Knee |
| 6,738,692 B2 | 5/2004 | Schienbein et al. |
| 6,765,315 B2 | 7/2004 | Hammerstrom et al. |
| 6,768,047 B2 | 7/2004 | Chang et al. |
| 6,788,033 B2 | 9/2004 | Vinciarelli |
| 6,795,318 B2 | 9/2004 | Haas et al. |
| 6,801,442 B2 | 10/2004 | Suzui et al. |
| 6,850,074 B2 | 2/2005 | Adams et al. |
| 6,882,131 B1 | 4/2005 | Takada et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,936,995 B2 | 8/2005 | Kapsokavathis et al. |
| 6,950,323 B2 | 9/2005 | Achleitner et al. |
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 | 8/2006 | Werner et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,148,669 B2 | 12/2006 | Maksimovic et al. |
| 7,158,359 B2 | 1/2007 | Bertele et al. |
| 7,158,395 B2 | 1/2007 | Deng et al. |
| 7,174,973 B1 | 2/2007 | Lysaght |
| 7,193,872 B2 | 3/2007 | Siri |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,277,304 B2 | 10/2007 | Stancu et al. |
| 7,282,814 B2 | 10/2007 | Jacobs |

| | | |
|---|---|---|
| 7,291,036 B1 | 11/2007 | Daily et al. |
| RE39,976 E | 1/2008 | Schiff et al. |
| 7,336,056 B1 | 2/2008 | Dening |
| 7,348,802 B2 | 3/2008 | Kasanyal et al. |
| 7,352,154 B2 | 4/2008 | Cook |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,394,237 B2 | 7/2008 | Chou et al. |
| 7,420,815 B2 | 9/2008 | Love |
| 7,435,134 B2 | 10/2008 | Lenox |
| 7,435,897 B2 | 10/2008 | Russell |
| 7,471,014 B2 | 12/2008 | Lum et al. |
| 7,504,811 B2 | 3/2009 | Watanabe et al. |
| 7,589,437 B2 | 9/2009 | Henne et al. |
| 7,600,349 B2 | 10/2009 | Liebendorfer |
| 7,602,080 B1 | 10/2009 | Hadar et al. |
| 7,605,498 B2 | 10/2009 | Ledenev et al. |
| 7,612,283 B2 | 11/2009 | Toyomura et al. |
| 7,646,116 B2 | 1/2010 | Batarseh et al. |
| 7,719,140 B2 | 5/2010 | Ledenev et al. |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,782,031 B2 | 8/2010 | Qiu et al. |
| 7,787,273 B2 | 8/2010 | Lu et al. |
| 7,804,282 B2 | 9/2010 | Bertele |
| 7,812,701 B2 | 10/2010 | Lee et al. |
| 7,839,022 B2 | 11/2010 | Wolfs |
| 7,843,085 B2 | 11/2010 | Ledenev et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,900,361 B2 | 3/2011 | Adest et al. |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 8,003,885 B2 | 8/2011 | Richter et al. |
| 8,004,116 B2 | 8/2011 | Ledenev et al. |
| 8,004,117 B2 | 8/2011 | Adest et al. |
| 8,013,472 B2 | 9/2011 | Adest et al. |
| 8,058,747 B2 | 11/2011 | Avrutsky et al. |
| 8,077,437 B2 | 12/2011 | Mumtaz et al. |
| 8,093,756 B2 | 1/2012 | Porter et al. |
| 8,093,757 B2 | 1/2012 | Wolfs |
| 8,102,144 B2 * | 1/2012 | Capp et al. ............... 320/101 |
| 8,111,052 B2 | 2/2012 | Glovinsky |
| 8,138,914 B2 | 3/2012 | Wong et al. |
| 8,204,709 B2 | 6/2012 | Presher, Jr. et al. |
| 8,289,742 B2 | 10/2012 | Adest et al. |
| 2001/0023703 A1 | 9/2001 | Kondo et al. |
| 2001/0034982 A1 | 11/2001 | Nagao et al. |
| 2002/0044473 A1 | 4/2002 | Toyomura et al. |
| 2002/0056089 A1 | 5/2002 | Houston |
| 2003/0058593 A1 | 3/2003 | Bertele et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0214274 A1 | 11/2003 | Lethellier |
| 2004/0041548 A1 | 3/2004 | Perry |
| 2004/0061527 A1 | 4/2004 | Knee |
| 2004/0125618 A1 | 7/2004 | De Rooij et al. |
| 2004/0140719 A1 | 7/2004 | Vulih et al. |
| 2004/0169499 A1 | 9/2004 | Huang et al. |
| 2004/0201279 A1 | 10/2004 | Templeton |
| 2004/0201933 A1 | 10/2004 | Blanc |
| 2004/0246226 A1 | 12/2004 | Moon |
| 2005/0002214 A1 | 1/2005 | Deng et al. |
| 2005/0005785 A1 | 1/2005 | Poss et al. |
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0162018 A1 | 7/2005 | Realmuto et al. |
| 2005/0172995 A1 | 8/2005 | Rohrig et al. |
| 2005/0226017 A1 | 10/2005 | Kotsopoulos et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0108979 A1 | 5/2006 | Daniel et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0171182 A1 | 8/2006 | Siri et al. |
| 2006/0174939 A1 | 8/2006 | Matan |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227578 A1 | 10/2006 | Datta et al. |
| 2006/0237058 A1 | 10/2006 | McClintock et al. |
| 2007/0044837 A1 | 3/2007 | Simburger et al. |
| 2007/0075711 A1 | 4/2007 | Blanc et al. |
| 2007/0081364 A1 | 4/2007 | Andreycak |
| 2007/0147075 A1 | 6/2007 | Bang |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0273342 A1 | 11/2007 | Kataoka et al. |
| 2007/0290636 A1 | 12/2007 | Beck et al. |
| 2008/0024098 A1 | 1/2008 | Hojo |
| 2008/0080177 A1 | 4/2008 | Chang |
| 2008/0088184 A1 | 4/2008 | Tung et al. |
| 2008/0097655 A1 | 4/2008 | Hadar et al. |
| 2008/0106250 A1 | 5/2008 | Prior et al. |
| 2008/0115823 A1 | 5/2008 | Kinsey |
| 2008/0136367 A1 | 6/2008 | Adest et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0150366 A1 | 6/2008 | Adest et al. |
| 2008/0164766 A1 | 7/2008 | Adest et al. |
| 2008/0179949 A1 | 7/2008 | Besser et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton et al. |
| 2009/0039852 A1 | 2/2009 | Fishelov et al. |
| 2009/0066399 A1 | 3/2009 | Chen et al. |
| 2009/0073726 A1 | 3/2009 | Babcock |
| 2009/0084570 A1 | 4/2009 | Gherardini et al. |
| 2009/0097172 A1 | 4/2009 | Bremicker et al. |
| 2009/0102440 A1 | 4/2009 | Coles |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0190275 A1 | 7/2009 | Gilmore et al. |
| 2009/0206666 A1 | 8/2009 | Sella et al. |
| 2009/0224817 A1 | 9/2009 | Nakamura et al. |
| 2009/0237042 A1 | 9/2009 | Glovinski |
| 2009/0237043 A1 | 9/2009 | Glovinsky |
| 2009/0242011 A1 | 10/2009 | Proisy et al. |

| | | | |
|---|---|---|---|
| 2009/0273241 A1 | 11/2009 | Gazit et al. | |
| 2009/0282755 A1 | 11/2009 | Abbott et al. | |
| 2009/0284998 A1 | 11/2009 | Zhang et al. | |
| 2009/0322494 A1 | 12/2009 | Lee | |
| 2010/0052735 A1 | 3/2010 | Burkland et al. | |
| 2010/0085670 A1 | 4/2010 | Palaniswami et al. | |
| 2010/0124027 A1 | 5/2010 | Handelsman et al. | |
| 2010/0139743 A1 | 6/2010 | Hadar et al. | |
| 2010/0214808 A1 | 8/2010 | Rodriguez | |
| 2010/0244575 A1 | 9/2010 | Coccia et al. | |
| 2010/0269430 A1 | 10/2010 | Haddock | |
| 2010/0277001 A1 | 11/2010 | Wagoner | |
| 2010/0282290 A1 | 11/2010 | Schwarze et al. | |
| 2010/0294528 A1 | 11/2010 | Sella et al. | |
| 2010/0294903 A1 | 11/2010 | Shmukler et al. | |
| 2010/0297860 A1 | 11/2010 | Shmukler et al. | |
| 2010/0301991 A1 | 12/2010 | Sella et al. | |
| 2010/0308662 A1 | 12/2010 | Schatz et al. | |
| 2011/0006743 A1 | 1/2011 | Fabbro | |
| 2011/0037600 A1 | 2/2011 | Takehara et al. | |
| 2011/0043172 A1 | 2/2011 | Dearn | |
| 2011/0084553 A1 | 4/2011 | Adest et al. | |
| 2011/0114154 A1 | 5/2011 | Lichy et al. | |
| 2011/0121652 A1 | 5/2011 | Sella et al. | |
| 2011/0125431 A1 | 5/2011 | Adest et al. | |
| 2011/0133552 A1 | 6/2011 | Binder et al. | |
| 2011/0140536 A1 | 6/2011 | Adest et al. | |
| 2011/0181251 A1 | 7/2011 | Porter et al. | |
| 2011/0181340 A1 | 7/2011 | Gazit | |
| 2011/0210611 A1 | 9/2011 | Ledenev et al. | |
| 2011/0254372 A1 | 10/2011 | Haines et al. | |
| 2011/0260866 A1 | 10/2011 | Avrutsky et al. | |
| 2011/0267859 A1 | 11/2011 | Chapman | |
| 2011/0271611 A1 | 11/2011 | Maracci et al. | |
| 2011/0273015 A1 | 11/2011 | Adest et al. | |
| 2011/0273016 A1 | 11/2011 | Adest et al. | |
| 2011/0285205 A1 | 11/2011 | Ledenev et al. | |
| 2011/0290317 A1 | 12/2011 | Naumovitz et al. | |
| 2011/0291486 A1 | 12/2011 | Adest et al. | |
| 2011/0316346 A1 | 12/2011 | Porter et al. | |
| 2012/0007613 A1 | 1/2012 | Gazit | |
| 2012/0019966 A1 | 1/2012 | DeBoer | |
| 2012/0032515 A1 | 2/2012 | Ledenev et al. | |
| 2012/0091810 A1 | 4/2012 | Aiello et al. | |

FOREIGN PATENT DOCUMENTS

| | | | |
|---|---|---|---|
| DE | 102005030907 A1 | 1/2007 | |
| DE | 102008057874 A1 | 5/2010 | |
| EP | 419093 A2 | 3/1991 | |
| EP | 420295 A1 | 4/1991 | |
| EP | 604777 A1 | 7/1994 | |
| EP | 756178 A2 | 1/1997 | |
| EP | 827254 A2 | 3/1998 | |
| EP | 1039621 A2 | 9/2000 | |
| EP | 1330009 A2 | 7/2003 | |
| EP | 1503490 A1 | 2/2005 | |
| EP | 1531542 A2 | 5/2005 | |
| EP | 1531545 A2 | 5/2005 | |
| EP | 1657557 A1 | 5/2006 | |
| EP | 1657797 A1 | 5/2006 | |
| EP | 1887675 A2 | 2/2008 | |
| EP | 2048679 A1 | 4/2009 | |
| EP | 2315328 A2 | 4/2011 | |
| EP | 2393178 A2 | 12/2011 | |
| ES | 2249147 A1 | 3/2006 | |
| ES | 2249149 A1 | 3/2006 | |
| GB | 2476508 A | 6/2011 | |
| JP | 61065320 A | 4/1986 | |
| JP | 8009557 A | 1/1996 | |
| JP | 11041832 A | 2/1999 | |
| JP | 11103538 A | 4/1999 | |
| JP | 11206038 A | 7/1999 | |
| JP | 11289891 A | 10/1999 | |
| JP | 11318042 A | 11/1999 | |
| JP | 2000339044 A | 12/2000 | |
| JP | 2002300735 A | 10/2002 | |
| JP | 2003124492 A | 4/2003 | |
| JP | 2003134667 A | 5/2003 | |
| JP | 2004194500 A | 7/2004 | |
| JP | 2004260944 A | 9/2004 | |
| JP | 2004334704 A | 11/2004 | |
| JP | 2005192314 A | 7/2005 | |
| JP | 2007058845 A | 3/2007 | |
| WO | 9313587 A1 | 7/1993 | |
| WO | 9613093 A1 | 5/1996 | |
| WO | 9823021 A2 | 5/1998 | |
| WO | 00/00839 A1 | 1/2000 | |
| WO | 00/21178 A1 | 4/2000 | |
| WO | 0075947 A1 | 12/2000 | |
| WO | 0231517 | 4/2002 | |
| WO | 03050938 A2 | 6/2003 | |
| WO | 03071655 A1 | 8/2003 | |
| WO | 2004023278 A2 | 3/2004 | |
| WO | 2004090993 A2 | 10/2004 | |
| WO | 2004107543 A2 | 12/2004 | |
| WO | 2005076444 A1 | 8/2005 | |
| WO | 2005076445 A1 | 8/2005 | |
| WO | 2006005125 A1 | 1/2006 | |
| WO | 2006007198 A1 | 1/2006 | |
| WO | 2006078685 A2 | 7/2006 | |
| WO | 2007006564 A2 | 1/2007 | |
| WO | 2007048421 A2 | 5/2007 | |
| WO | 2007073951 A1 | 7/2007 | |
| WO | 2007084196 A2 | 7/2007 | |
| WO | 2007090476 A2 | 8/2007 | |
| WO | 2007113358 A1 | 10/2007 | |
| WO | 2008125915 A2 | 10/2008 | |
| WO | 2008132551 A2 | 11/2008 | |
| WO | 2008132553 A2 | 11/2008 | |
| WO | 2008142480 A2 | 11/2008 | |
| WO | 2009007782 A2 | 1/2009 | |
| WO | 2009051853 A1 | 4/2009 | |
| WO | 2009118682 A2 | 10/2009 | |
| WO | 2009118683 A2 | 10/2009 | |
| WO | 2009073868 A1 | 11/2009 | |
| WO | 2009136358 A1 | 11/2009 | |
| WO | 2010065043 A1 | 6/2010 | |
| WO | 2010065388 A1 | 6/2010 | |
| WO | 2010072717 A1 | 7/2010 | |
| WO | 2010078303 A2 | 7/2010 | |
| WO | 2010134057 A1 | 11/2010 | |
| WO | 2011011711 A2 | 1/2011 | |
| WO | 2011017721 A1 | 2/2011 | |
| WO | 2011023732 A2 | 3/2011 | |
| WO | 2011059067 A1 | 5/2011 | |
| WO | 2011074025 A1 | 6/2011 | |

OTHER PUBLICATIONS

Woyte, et al., "Mains Monitoring and Protection in a European Context", 17th European Photovoltaic Solar Energy Conference and Exhibition, Munich, Germany, Oct. 22-26, 2001, Achim Woyte et al., pp. 1-4.

"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.

Fairchild Semiconductor, Application Note 9016, IGBT Basics 1, by K.S. Oh Feb. 1, 2001.

"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

Walker, "A DC Circuit Breaker for an Electric Vehicle Battery Pack", Australasian Universities Power Engineering Conference and IEAust Electric Energy Conference, Sep. 26-29, 1999.

Combined Search and Examination Report for GB1018872.0 dated Apr. 15, 2011, 2 pages.

International Search Report and Opinion of International Patent Application PCT/2009/051221, dated Oct. 19, 2009.

International Search Report and Opinion of International Patent Application PCT/2009/051222, dated Oct. 7, 2009.

Communication in EP07874025.5 dated Aug. 17, 2011.

(56) References Cited

OTHER PUBLICATIONS

IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section.18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximim Power Point Enabling Converters", School of Information Technology and Electrical Engineering The Univiversity of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—Mailing date: Nov. 8, 2012.
Gwon-Jong Yu et al: "Maximum power point tracking with temperature compensation of photovoltaic for air conditioning system with fuzzy controller", 19960513; 19960513-19960517, May 13, 1996, pp. 1429-1432, XP010208423.
Extended European Search Report—EP12177067.1—Mailing Date: Dec. 7, 2012.
GB Combined Search and Examination Report—GB1200423.0—Mailing date: Apr. 30, 2012.
GB Combined Search and Examination Report—GB1201499.9—Mailing date: May 28, 2012.
GB Combined Search and Examination Report—GB1201506.1—Mailing date: May 22, 2012.
"Study of Energy Storage Capacitor Reduction for Single Phase PWM Rectifier", Ruxi Wang et al., Virginia Polytechnic Institute and State University, IEEE Applied Power Electronics Conference and Exposition, 2009.
"Multilevel Inverters: A Survey of Topologies, Controls, and Applications", José Rodriguez et al., IEEE Transactions on Industrial Electronics, vol. 49, No. 4, Aug. 2002.
Extended European Search Report—EP 08878650.4—Mailing date: Mar. 28, 2013.
Ciobotaru, et al., Control of single-stage single-phase PV inverter, Aug. 7, 2006.
International Search Report and Written Opinion for PCT/IB20071004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Converence, Feb. 2001, Colorado Power Electronics Center Publications.
Chen, et al., "Buck-Boost PWM Converters Having Two Independently Controlled Switches", IEEE Power Electronics Specialists Converence, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "PhotoVoltaic DC-DC Module Integrated Converter for Novel Cascaded and Bypass Grid Connection Topologies-Design and Optimisation", 37th IEEE Power Electronics Specialists Converence, Jun. 18-22, 2006, Jeju, Korea.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.

(56) References Cited

OTHER PUBLICATIONS

Knaupp, et al., "Operation of a 10 KW PV Façade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al. "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 IUC-1290 Unlimited Release, Printed Dec. 1996, "Photovoltaic Power Systems and the National Electrical Code: Suggested Practices", by John Wiles, Southwest Technology Development Instutte New Mexico State University Las Cruces, NM.
United Kingdom Intellectual Property Office, Combined Search and Examination Report Under Sections 17 and 18(3), GB1020862.7, dated Jun. 16, 2011.

\* cited by examiner

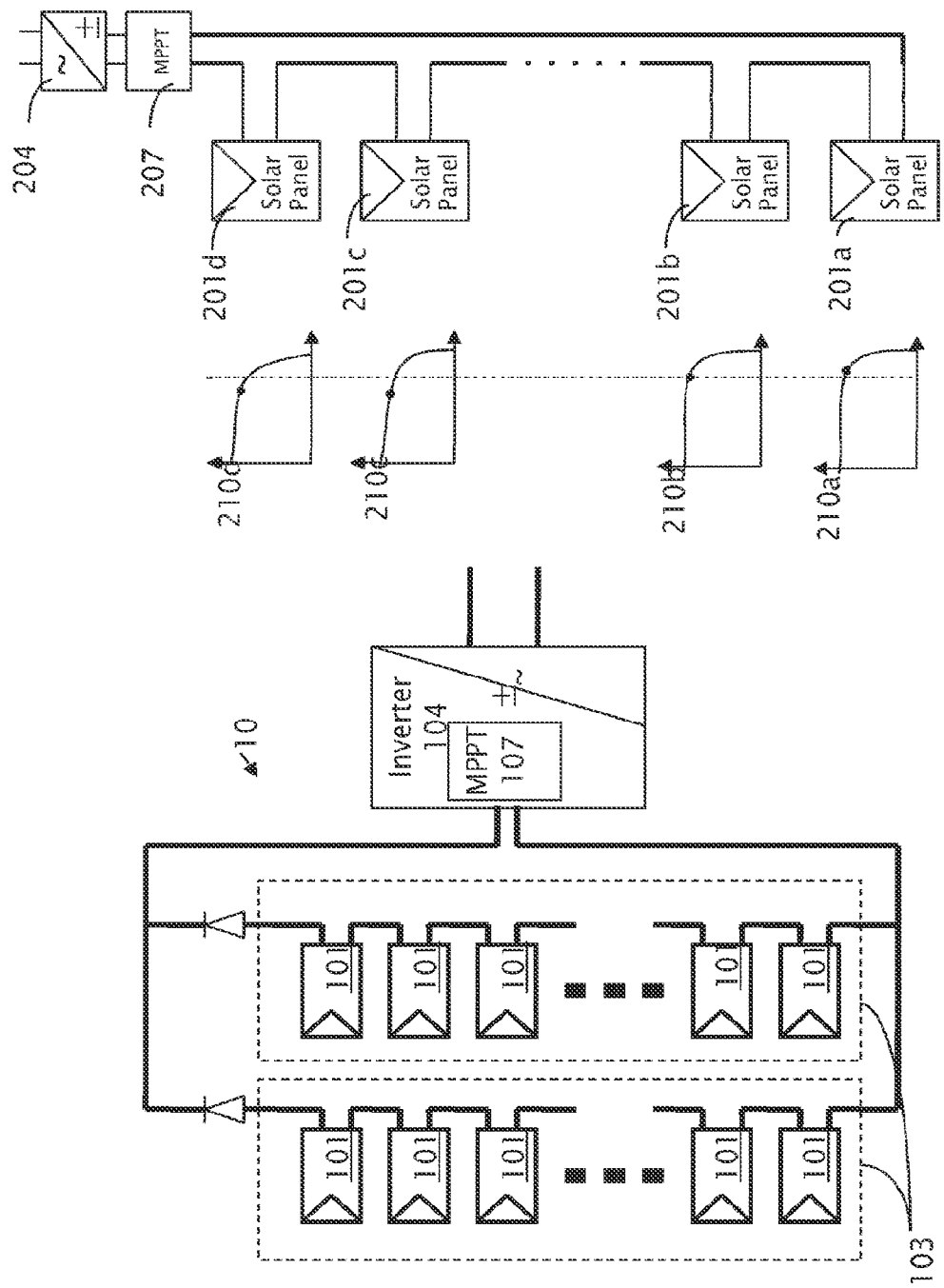

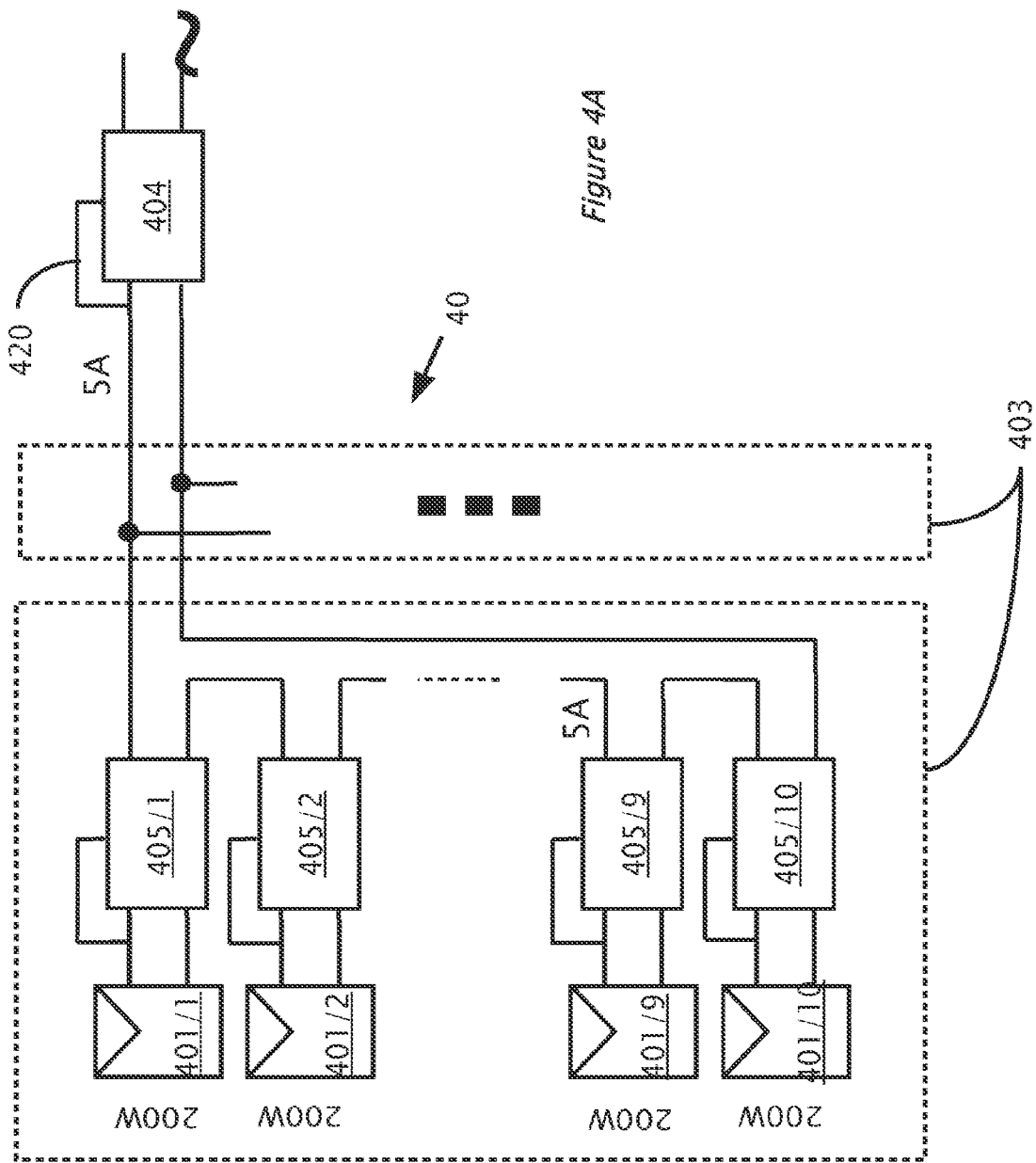

US 8,659,188 B2

DISTRIBUTED POWER HARVESTING SYSTEMS USING DC POWER SOURCES

CROSS REFERENCE TO RELATED APPLICATIONS

The present application is a continuation of U.S. application Ser. No. 13/186,601, filed Jul. 20, 2011, which issued as U.S. Pat. No. 8,384,243 on Feb. 26, 2013, which is a continuation-in-part application of pending U.S. application Ser. No. 11/950,271 filed Dec. 4, 2007, which claims priority to U.S. Provisional Application No. 60/916,815 filed May 9, 2007, U.S. Provisional Application No. 60/908,095 filed Mar. 26, 2007, U.S. Provisional Application No. 60/868,962 filed Dec. 7, 2006, U.S. Provisional Application No. 60/868,851 filed Dec. 6, 2006, and U.S. Provisional Application No. 60/868,893 filed Dec. 6, 2006. U.S. patent application Ser. Nos. 13/186,601 and 11/950,271 are incorporated herein by reference in their entireties.

BACKGROUND

1. Field of the Invention

The field of the invention relates generally to power production from distributed direct current (DC) power sources, and more particularly to management of distributed DC power sources in series installations.

2. Related Arts

The recent increased interest in renewable energy has led to increased research in systems for distributed generation of energy, such as photovoltaic cells (PV), fuel cells, batteries (e.g., for hybrid cars), etc. Various topologies have been proposed for connecting these power sources to the load, taking into consideration various parameters, such as voltage/current requirements, operating conditions, reliability, safety, costs, etc. For example, most of these sources may provide low voltage output (normally a few volts for one cell, or a few tens of volts for serially connected cells), so that many of them need to be connected serially to achieve the required operating voltage. Conversely, a serial connection may fail to provide the required current, so that several strings of serial connections may need to be connected in parallel to provide the required current.

It is also known that power generation from each of these sources may depend on manufacturing, operating, and environmental conditions. For example, various inconsistencies in manufacturing may cause two identical sources to provide different output characteristics. Similarly, two identical sources may react differently to operating and/or environmental conditions, such as load, temperature, etc. In practical installations, different source may also experience different environmental conditions, e.g., in solar power installations some panels may be exposed to full sun, while others may be shaded, thereby delivering different power output. In a multiple-battery installation, some of the batteries may age differently, thereby delivering different power output. While these problems and the solutions provided by aspects of the subject invention may be applicable to any distributed power system, the following discussion turns to solar energy so as to provide better understanding by way of a concrete example.

In view of the above, a newly proposed topology for connecting multiple DC power sources to the load should also lend itself to easy testing and operational verification during and after installation.

BRIEF SUMMARY

According to aspects of the present invention there is provided a power converter including input terminals and output terminals. The power converter may be operative to convert input power at the input terminals to an output power at the output terminals. A controller may be adapted for controlling the power conversion of the power converter. A temperature sensor may be adapted for measuring a temperature in the environment of the power converter. The temperature sensor connects to an input of the controller. The controller may be configured for inputting temperature signal from the temperature sensor and based on the temperature signal adjusts the input power. The input terminals may be adapted for connecting to a photovoltaic panel. The power converter may be operative to convert the input power received from the photovoltaic panel at the input terminals to the output power at the output terminals. During operation of the power converter a control loop may set input voltage and/or input current at the input terminals according to predetermined criteria including a temperature criterion based on the temperature signal as input from the temperature sensor. The predetermined criteria may provide for maximizing the input power based on the temperature signal as input from the temperature sensor without completely shutting down the power converter and ceasing completely the conversion of the input power to the output power.

According to further aspects of the present invention there is provided a distributed power system including a power converter. The power converter may be operative to convert input power at the input terminals to an output power at the output terminals. A controller may be adapted for controlling the power conversion of the power converter. A temperature sensor may be adapted for measuring a temperature in or in the environment of the power converter. The temperature sensor connects to an input of the controller. The controller may be configured for inputting a temperature signal from the temperature sensor and based on the temperature signal adjusts the input power. The input terminals may be adapted for connecting to a photovoltaic panel. The power converter may be operative to convert the input power received from the photovoltaic panel at the input terminals to the output power at the output terminals. The distributed power system may include a load including load input terminals and load output terminals. The load input terminals may be configured for receiving power from the power converter. The load may be either an inverter or a direct current (DC) to DC power converter.

According to further aspects there may be provided a method for maintaining reliability of a distributed power system including a power converter having input terminals and output terminals. Input power may be received at the input terminals. The input power may be converted to an output power at the output terminals. A temperature may be measured in or in the environment of the power converter. A temperature signal may be input responsive to the temperature. The power conversion may be controlled by adjusting the input power based on the temperature signal. The input terminals may be adapted for connecting to a photovoltaic panel and for receiving power from the photovoltaic panel. The power conversion of the input power to the output power may be controlled to maximize the input power by setting at the input terminals the input voltage or the input current according to predetermined criteria. One of the predetermined criteria may be configured to reduce the input power based on the temperature signal responsive to the temperature. The adjustment of input power reduces the input voltage and/or input current thereby lowering the temperature of the power converter. The adjusting does not include a complete shut down of the power converter and ceasing completely the conversion of the input power to the output power.

BRIEF DESCRIPTION OF THE DRAWINGS

The invention is herein described, by way of example only, with reference to the accompanying drawings, wherein:

FIG. 1 illustrates a conventional centralized power harvesting system using DC power sources.

FIG. 2 illustrates current versus voltage characteristic curves for one serial string of DC sources.

FIGS. 4A and 4B illustrate the operation of the system of FIG. 3 under different conditions, according to aspects of the invention.

Figure 3:
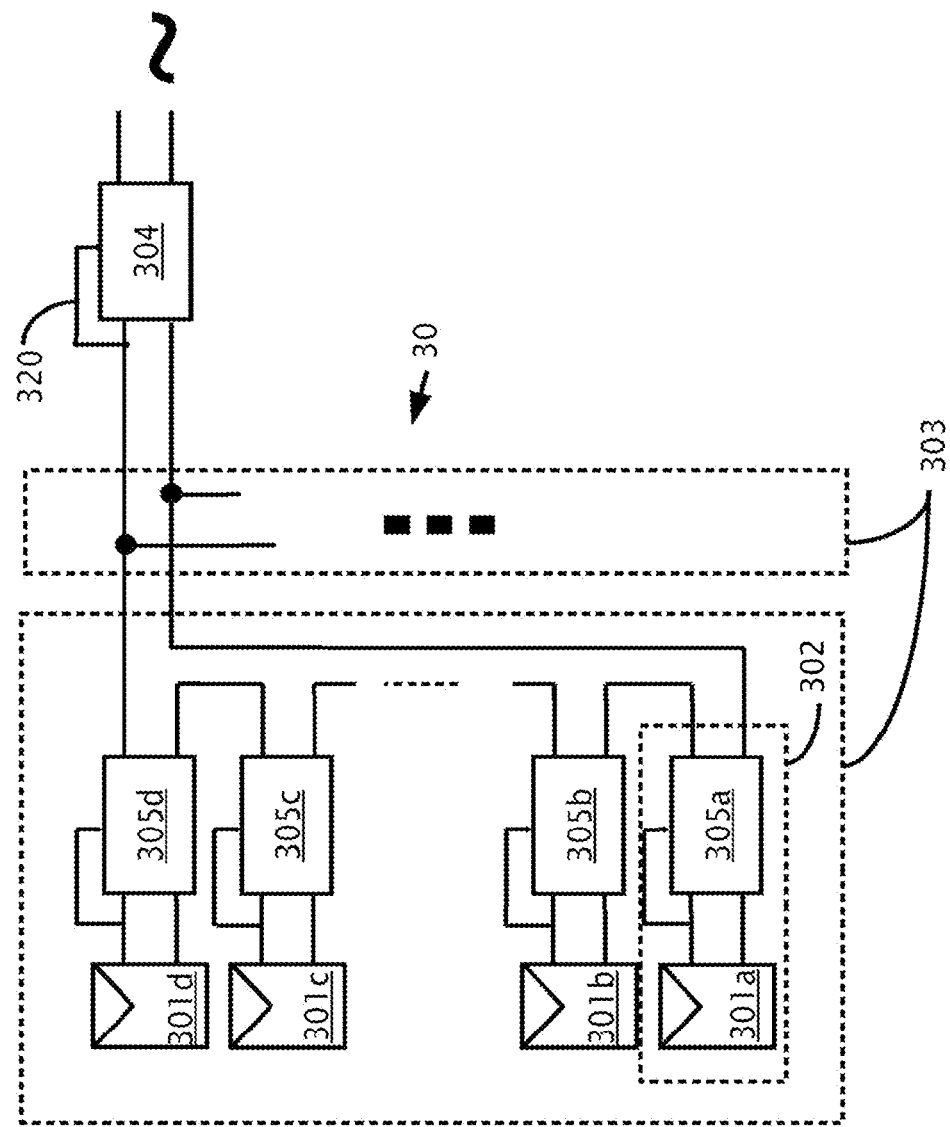
FIG. 3 illustrates a distributed power harvesting system, according to aspects of the invention, using DC power sources.

The foregoing and/or other aspects will become apparent from the following detailed description when considered in conjunction with the accompanying drawing figures.

DETAILED DESCRIPTION

Reference will now be made in detail to features of the present invention, examples of which are illustrated in the accompanying drawings, wherein like reference numerals refer to the like elements throughout. The features are described below to explain the present invention by referring to the figures.

A conventional installation of solar power system 10 is illustrated in FIG. 1. Since the voltage provided by each individual solar panel 101 may be low, several panels may be connected in series to form a string of panels 103. For a large installation, when higher current may be required, several strings 103 may be connected in parallel to form the overall system 10. The solar panels may be mounted outdoors, and their leads may be connected to a maximum power point tracking (MPPT) module 107 and then to an inverter 104. The MPPT 107 may be typically implemented as part of the inverter 104. The harvested power from the DC sources may be delivered to the inverter 104, which converts the fluctuating direct-current (DC) into alternating-current (AC) having a desired voltage and frequency, which may be usually 110V or 220V at 60 Hz, or 220V at 50 Hz (It may be interesting to note the even in the US many inverters produce 220V, which may be then split into two 110V feeds in the electric box). The AC current from the inverter 104 may then be used for operating electric appliances or fed to the power grid. Alternatively, if the installation is not tied to the grid, the power extracted from the inverter may be directed to a conversion and charge/discharge circuit to store the excess power created as charge in batteries. In case of a battery-tied application, the inversion stage might be skipped altogether, and the DC output of the MPPT stage 107 may be fed into the charge/discharge circuit.

As noted above, each solar panel 101 supplies relatively very low voltage and current. The challenge facing the solar array designer may be to produce a standard AC current at 120V or 220V root-mean-square (RMS) from a combination of the low voltages of the solar panels. The delivery of high power from a low voltage requires very high currents, which cause large conduction losses on the order of the second power of the current ($I^2$). Furthermore, a power inverter, such as the inverter 104, which may be used to convert DC current to AC current, may be most efficient when its input voltage may be slightly higher than its output RMS voltage multiplied by the square root of 2. Hence, in many applications, the power sources, such as the solar panels 101, may be combined in order to reach the correct voltage or current. The most common method connects the power sources in series in order to reach the desirable voltage and in parallel in order to reach the desirable current, as shown in FIG. 1. A large number of the panels 101 may be connected into a string 103 and the strings 103 may be connected in parallel to the power inverter 104. The panels 101 may be connected in series in order to reach the minimal voltage required for the inverter. Multiple strings 103 may be connected in parallel into an array to supply higher current, so as to enable higher power output.

While this configuration may be advantageous in terms of cost and architecture simplicity, several drawbacks have been identified in the literature for such architecture. One drawback may be inefficiencies cause by non-optimal power draw from each individual panel, as explained below. As explained above, the output of the DC power sources may be influenced by many conditions. Therefore, to maximize the power draw from each source, one may need to draw the combination of voltage and current that provides the peak power for the currently prevailing conditions. As conditions change, the combination of voltage and current draw may need to be changed as well.

FIG. 2 illustrates one serial string of DC sources, e.g., solar panels 201a-201d, connected to MPPT circuit 207 and inverter 204. The current versus voltage (IV) characteristics plotted (210a-210d) to the left of each DC source 201. For each DC source 201, the current decreases as the output voltage increases. At some voltage value the current goes to zero, and in some applications may assume a negative value, meaning that the source becomes a sink. Bypass diodes may be used to prevent the source from becoming a sink. The power output of each source 201, which is equal to the product of current and voltage (P=I*V), varies depending on the voltage drawn from the source. At a certain current and voltage, close to the falling off point of the current, the power reaches its maximum. It may be desirable to operate a power generating cell at this maximum power point. The purpose of the MPPT may be to find this point and operate the system at this point so as to draw the maximum power from the sources.

In a typical, conventional solar panel array, different algorithms and techniques may be used to optimize the integrated power output of the system 10 using the MPPT module 107. The MPPT module 107 receives the current extracted from all of the solar panels together and tracks the maximum power point for this current to provide the maximum average power such that if more current may be extracted, the average voltage from the panels starts to drop, thus lowering the harvested power. The MPPT module 107 maintains a current that yields the maximum average power from the overall system 10.

However, since the sources 201a-201d may be connected in series to a single MPPT 207, the MPPT must select a single point, which would be somewhat of an average of the maximum power point (MPP) of the serially connected sources. In practice, it may be very likely that the MPPT would operate at an I-V point that may be optimum to only a few or none of the sources. In the example of FIG. 2, the selected point may be the maximum power point for source 201b, but may be off the maximum power point for sources 201*a*, 201*c* and 201*d*. Consequently, the arrangement may be not operated at best achievable efficiency.

Turning back to the example of a solar system 10 of FIG. 1, fixing a predetermined constant output voltage from the strings 103 may cause the solar panels to supply lower output power than otherwise possible. Further, each string 103 carries a single current that may be passed through all of solar panels 101 along string 193. If solar panels 101 may be mismatched due to manufacturing differences, aging or if they malfunction or are placed under different shading conditions, the current, voltage and power output of each panel may be different. Forcing a single current through all of the panels of the string may cause the individual panels to work at a non-optimal power point and can also cause panels which may be highly mismatched to generate "hot spots" due to the high current flowing through them. Due to these and other drawbacks of conventional centralized methods, the solar panels may have to be matched properly. In some cases external diodes may be used to bypass the panels that may be highly mismatched. In conventional multiple string configurations all strings have to be composed of exactly the same number of solar panels and the panels may be selected of the same model and must be install at exactly the same spatial orientation, being exposed to the same sunlight conditions at all times. This may be difficult to achieve and can be very costly.

Various different topologies have been proposed in order to overcome the above deficiencies of the serial installation. For example, some have proposed to have inverters coupled to each DC source, and connect all of the inverters in parallel. Others have proposed to have DC/DC converter connected to each DC source, and to connect all of the converters serially or in parallel to a central inverter. Among the DC/DC converters proposed for use with the DC sources may be boost converter, buck converter, buck-boost converter, or a Cuk converter. It has also been proposed to incorporate MPPT into each DC power source, e.g., into each solar panel, and connect the panels serially.

Integrating inverters into the individual cells may have many drawbacks, including high costs, low safety (especially in solar installations), and reliability. Therefore, serial connection may be still preferred, especially for solar panel installations. The proposals for including DC-DC converters and MPPT into the individual sources, and then connect their outputs serially to an inverter may be attractive. However, incorporating MPPT into each panel may be still problematic in serial application, as each MPPT may attempt to drive its source at different current, while in a serial connection the same current must flow through all of the panels. Moreover, it may be unclear what type of DC-DC converter would provide the best results and how to incorporate an MPPT into such an arrangement. Therefore, solutions may be still needed for an effective topology for connecting multiple DC power sources to the load, i.e., power grid, power storage bank, etc.

As already mentioned above, various environmental and operational conditions may impact the power output of DC power sources. In the case of solar panels, solar radiance, ambient temperature, and shading, whether from near objects such as trees or far objects such as clouds, may impact the power extracted from each solar panel. Depending on the number and type of panels used, the extracted power may vary widely in the voltage and current. Owners and even professional installers may find it difficult to verify the correct operation of the solar system. With time, many other factors, such as aging, dust and dirt collection and module degradation may affect the performance of the solar array.

The sensitivity of photovoltaic panels to external conditions may be even more profound when concentrated photovoltaics (CPV) are be used. In such installations, the sun radiation may be concentrated by use of lenses or mirrors onto small cells. These cells may be much more efficient then typical PV cells and use a technology knows as double- or triple-junction, in which a number of p-n junctions may be constructed one on top of the other—each junction converts light from a certain part of the spectrum and allows the rest to pass-through to the next junction. Thus, these cells may be much more efficient (with peak efficiencies of over 40%). Since these cells may be expensive, they may be usually used in CPV applications which call for smaller cells. However, the power output of CPV installations may depend upon fluctuations in the intensity of different parts of the spectrum of the sun (and not only the total intensity), and imperfections or distortions in the lenses or mirrors used. Thus, having a single MPPT for many panels may lead to significant power loss, and great benefits may be realized from using a panel- (or cell-) level MPPT as described in aspects of the present invention.

Another field in which traditional photovoltaic installations face many problems may be the developing market of building-integrated photovoltaics (BIPV). In BIPV installations, the panels may be integrated into buildings during construction—either as roof panels or as structural or additional elements in the walls and windows. Thus, BIPV installations may suffer greatly from local partial shading due to the existence of other structural elements in the vicinity of the panels. Moreover, the panels may be naturally positioned on many different facets of the building, and therefore the lighting conditions each panel experiences may vary greatly. Since in traditional solutions the panels may be stringed together to a joint MPPT, much power may be lost. A solution that could harvest more power would obviously be very beneficial in installations of this type.

Yet another problem with traditional installations may be the poor energy utilization in cases of low sun-light. Most inverters require a certain minimal voltage (typically between 150V to 350V) in order to start functioning. If there is low light, the aggregated voltage from the panels may not reach this minimal value, and the power may be thus lost. A solution that could boost the voltage of panels suffering from low light, would therefore allow for the produced energy to be harvested.

During installation of a solar array according to the conventional configurations 10, the installer can verify the correctness of the installation and performance of the solar array by using test equipment to check the current-voltage characteristics of each panel, each string and the entire array. In practice, however, individual panels and strings may be generally either not tested at all or tested only prior to connection. This happens because current measurement may be done by either a series connection to the solar array or a series resistor in the array which may be typically not convenient. Instead, only high-level pass/fail testing of the overall installation may be performed.

After the initial testing of the installation, the solar array may be connected to inverter 104 which may include a monitoring module which monitors performance of the entire array. The performance information gathered from monitoring within the inverter 104 may include integrated power output of the array and the power production rate, but the information may lack any fine details about the functioning of individual solar panels. Therefore, the performance information provided by monitoring at the inverter 104 may be usually not sufficient to understand if power loss is due to environmental conditions, from malfunctions or from poor installation or maintenance of the solar array. Furthermore, integrated information may not pinpoint which of solar panels 101 are be responsible for a detected power loss.

Aspects and examples of the present invention provide a system and method for combining power from multiple DC power sources into a single power supply. According to these aspects, each DC power source may be associated with a DC-DC power converter. Modules formed by coupling the DC power sources to their associated converters may be coupled in series to provide a string of modules. The string of modules may be then coupled to an inverter having its input voltage fixed. A maximum power point control loop in each converter harvests the maximum power from each DC power source and transfers this power as output from the power converter. For each converter, substantially all the input power may be converted to the output power, such that the conversion efficiency may be 90% or higher in some situations. Further, the controlling may be performed by fixing the input current or input voltage of the converter to the maximum power point and allowing output voltage of the converter to vary. For each power source, one or more sensors perform the monitoring of the input power level to the associated converter. In some aspects, a microcontroller may perform the maximum power point tracking and control in each converter by using pulse width modulation to adjust the duty cycle used for transferring power from the input to the output.

One aspect may provide a greater degree of fault tolerance, maintenance and serviceability by monitoring, logging and/or communicating the performance of each solar panel. In one aspect, the microcontroller that may be used for maximum power point tracking, may also be used to perform the monitoring, logging and communication functions. These functions may allow for quick and easy troubleshooting during installation, thereby significantly reducing installation time. These functions may be also beneficial for quick detection of problems during maintenance work. Aspects may also allow easy location, repair, or replacement of failed solar panels. When repair or replacement may be not feasible, bypass features of may also provide increased reliability.

In one aspect, features of the present invention relate to arrays of solar cells where the power from the cells may be combined. Each converter may be attached to a single solar cell, or a plurality of cell connected in series, in parallel, or both, e.g., parallel connection of strings of serially connected cells. In one feature each converter may be attached to one panel of photovoltaic strings. However, while applicable in the context of solar power technology, the aspects of the present invention may be used in any distributed power network using DC power sources. For example, they may be used in batteries with numerous cells or hybrid vehicles with multiple fuel cells on board. The DC power sources may be solar cells, solar panels, electrical fuel cells, electrical batteries, and the like. Further, although the discussion below relates to combining power from an array of DC power sources into a source of AC voltage, the aspects of the present invention may also apply to combining power from DC sources into another DC voltage.

FIG. 3 illustrates a distributed power harvesting configuration 30, according to a feature of the present invention. Configuration 30 enables connection of multiple power sources, for example solar panels 301a-301d, to a single power supply. In one aspect the series string of all of the solar panels may be coupled to an inverter 304. In another aspect, several serially connected strings of solar panels may be connected to a single inverter 304. The inverter 304 may be replaced by other elements, such as, e.g., a charging regulator for charging a battery bank.

In configuration 30, each solar panel 301a-301d may be connected to a separate power converter circuit 305a-305d. One solar panel together with its associated power converter circuit forms a module, e.g., module 302. Each converter 305a-305d may adapt optimally to the power characteristics of the connected solar panel 301a-301d and may transfer the power efficiently from converter input to converter output. The converters 305a-305d can be buck converters, boost converters, buck/boost converters, flyback or forward converters, etc. The converters 305a-305d may also contain a number of component converters, for example a serial connection of a buck and a boost converter.

Each converter 305a-305d may include a control loop that receives a feedback signal, not from the converter's output current or voltage, but rather from the converter's input coming from the solar panel 301. An example of such a control loop may be a maximum power point tracking (MPPT) loop. The MPPT loop in the converter locks the input voltage and current from each solar panel 301a-301d to its optimal power point.

Conventional DC-to-DC converters may have a wide input voltage range at their input and an output voltage that may be predetermined and fixed. In these conventional DC-to-DC voltage converters, a controller within the converter monitors the current or voltage at the input, and the voltage at the output. The controller determines the appropriate pulse width modulation (PWM) duty cycle to fix the output voltage to the predetermined value by increasing the duty cycle if the output voltage drops. Accordingly, the conventional converter may include a feedback loop that closes on the output voltage and uses the output voltage to further adjust and fine tune the output voltage from the converter. As a result of changing the output voltage, the current extracted from the input may be also varied.

In the converters 305a-305d, according to aspects of the present invention, a controller within the converter 405 monitors the voltage and current at the converter input and determines the PWM in such a way that maximum power may be extracted from the attached panel 301a-301d. The controller of the converter 405 dynamically tracks the maximum power point at the converter input. In the aspects of the present invention, the feedback loop may be closed on the input power in order to track maximum input power rather than closing the feedback loop on the output voltage as performed by conventional DC-to-DC voltage converters.

As a result of having a separate MPPT circuit in each converter 305a-305d, and consequently for each solar panel 301a-301d, each string 303 in the feature shown in FIG. 3 may have a different number or different brand of panels 301a-301d connected in series. The circuit of FIG. 3 continuously performs MPPT on the output of each solar panel 301a-301d to react to changes in temperature, solar radiance, shading or other performance factors that may impact that particular solar panel 301a-301d. As a result, the MPPT circuit within the converters 305a-305d may harvest the maximum possible power from each panel 301a-301d and transfers this power as output regardless of the parameters impacting the other solar panels.

As such, the aspects of the invention shown in FIG. 3 may continuously track and maintain the input current and the input voltage to each converter at the maximum power point of the DC power source providing the input current and the input voltage to the converter. The maximum power of the DC power source that may be input to the converter may be also output from the converter. The converter output power may be at a current and voltage different from the converter input current and voltage. The output current and voltage from the converter may be responsive to requirements of the series connected portion of the circuit.

In one aspect, the outputs of converters 305a-305d may be series connected into a single DC output that forms the input to the load or power supplier, in this example, inverter 304. The inverter 304 converts the series connected DC output of the converters into an AC power supply. The load, in this case inverter 304, regulates the voltage at the load's input. That may be, in this example, an independent control loop 320 which holds the input voltage at a set value, say 400 volts. Consequently, the inverter's input current may be dictated by the available power, and this may be the current that flows through all serially connected DC sources. On the other hand, while the output of the DC-DC converters must be at the inverter's current input, the current and voltage input to the converter may be independently controlled using the MPPT.

In the conventional art, the input voltage to the load may be allowed to vary according to the available power. For example, when a lot of sunshine may be available in a solar installation, the voltage input to the inverter can vary even up to 1000 volts. Consequently, as sunshine illumination varies, the voltage varies with it, and the electrical components in the inverter (or other power supplier or load) may be exposed to varying voltage. This tends to degrade the performance of the components and ultimately may cause them to fail. On the other hand, by fixing the voltage or current to the input of the load or power supplier, here the inverter, the electrical components may be always exposed to the same voltage or current and therefore would have extended service life. For example, the components of the load (e.g., capacitors, switches and coil of the inverter) may be selected so that at the fixed input voltage or current they operate at, say, 60% of their rating. This would improve the reliability and prolong the service life of the component, which may be critical for avoiding loss of service in applications such as solar power systems.

Figure 4B:
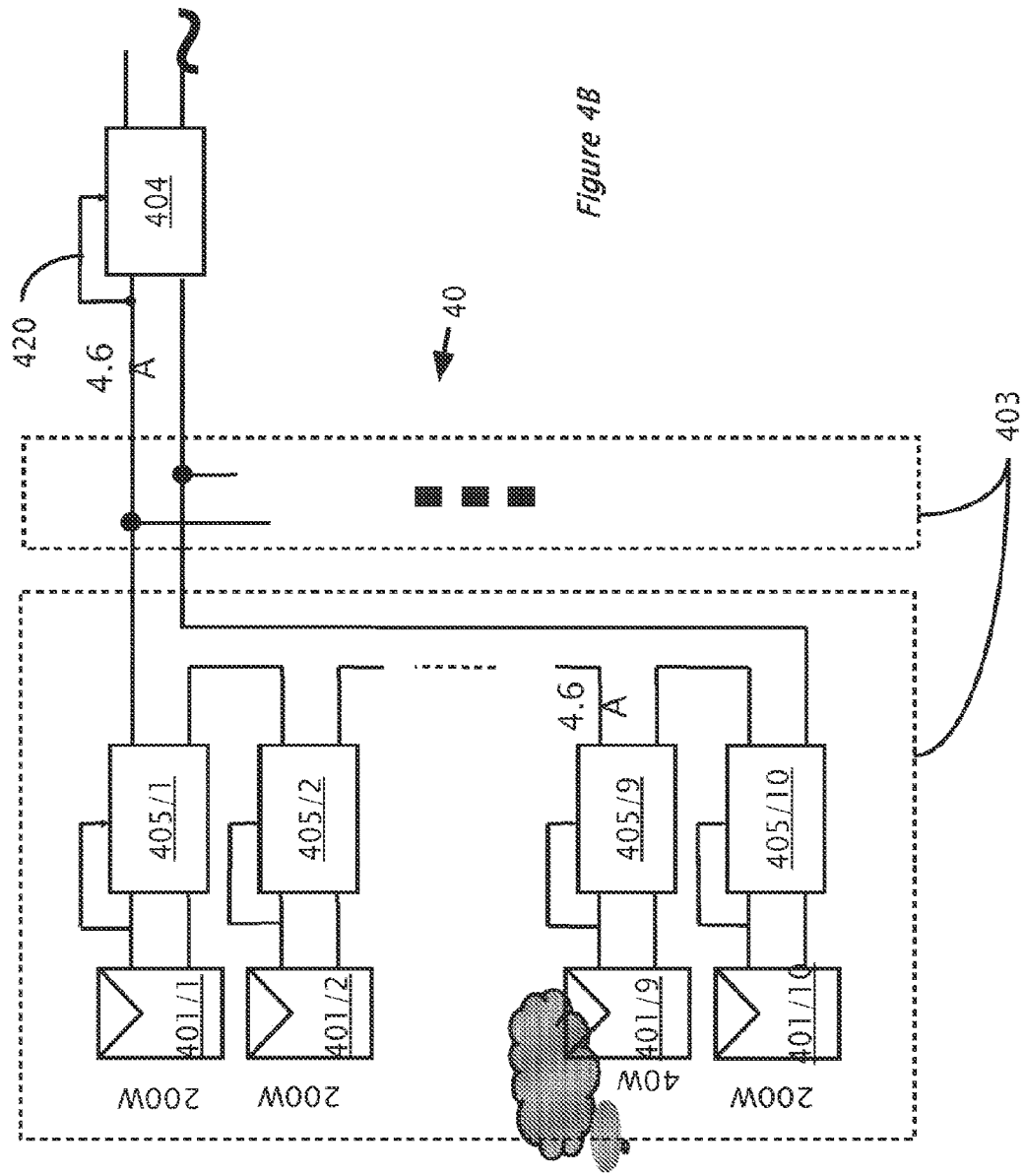

FIGS. 4A and 4B illustrate the operation of the system of FIG. 3 under different conditions, according to aspects of the present invention. The exemplary configuration 40 may be similar to configuration 30 of FIG. 3. In the example shown, ten DC power sources 401/1 through 401/10 may be connected to ten power converters 405/1 through 405/10, respectively. The modules formed by the DC power sources and their corresponding converters may be coupled together in series to form a string 403. In one aspect of the invention, the series-connected converters 405 may be coupled to a DC-to-AC inverter 404.

The DC power sources may be solar panels and the example may be discussed with respect to solar panels as one illustrative case. Each solar panel 401 may have a different power output due to manufacturing tolerances, shading, or other factors. For the purpose of the present example, an ideal case may be illustrated in FIG. 4A, where efficiency of the DC-to-DC conversion may be assumed to be 100% and the panels 501 may be assumed to be identical. In some aspects, efficiencies of the converters may be quite high and range at about 95%-99%. So, the assumption of 100% efficiency may be not unreasonable for illustration purposes. Moreover, according to features of the subject invention, each of the DC-DC converters may be constructed as a power converter, i.e., it transfers to its output the entire power it receives in its input with very low losses.

Power output of each solar panel 401 may be maintained at the maximum power point for the panel by a control loop within the corresponding power converter 405. In the example shown in FIG. 4A, all of the panels may be exposed to full sun illumination and each solar panel 401 provides 200 W of power. Consequently, the MPPT loop may draw current and voltage level that may transfer the entire 200 W from the panel to its associated converter. That may be, the current and voltage dictated by the MPPT form the input current $I_{in}$ and input voltage $V_{in}$ to the converter. The output voltage may be dictated by the constant voltage set at the inverter 404, as will be explained below. The output current $I_{out}$ would then be the total power, i.e., 200 W, divided by the output voltage $V_{out}$.

As noted above, according to a feature of the invention, the input voltage to inverter 404 may be controlled by the inverter (in this example, kept constant), by way of control loop 420. For the purpose of this example, assume the input voltage may be kept as 400V (ideal value for inverting to 220 VAC). Since we assume that there may be ten serially connected power converters, each providing 200 W, we can see that the input current to the inverter 404 is 2000 W/400V=5 A. Thus, the current flowing through each of the converters 401/1-401/10 must be 5 A. This means that in this idealized example each of the converters provides an output voltage of 200 W/5 A=40V. Now, assume that the MPPT for each panel (assuming perfect matching panels) dictates $V_{MPP}$=32V. This means that the input voltage to the inverter would be 32V, and the input current would be 200 W/32V=6.25 A.

We now turn to another example, where the system may be still maintained at an ideal mode (i.e., perfectly matching DC sources and entire power may be transferred to the inverter), but the environmental conditions may be not ideal. For example, one DC source may be overheating, may be malfunctioning, or, as in the example of FIG. 4B, the ninth solar panel 401/9 may be shaded and consequently produces only 40 W of power. Since we keep all other conditions as in the example of FIG. 4A, the other nine solar panels 401 may be unshaded and still produce 200 W of power. The power converter 405/9 includes MPPT to maintain the solar panel 501/9 operating at the maximum power point, which may be now lowered due to the shading.

The total power available from the string may be now 9×200 W+40 W=1840 W. Since the input to the inverter may be still maintained at 400V, the input current to the inverter will now be 1840 W/40V=4.6 A. This means that the output of all of the power converters 405/1-405/10 in the string must be at 4.6 A. Therefore, for the nine unshaded panels, the converters will output 200 W/4.6 A=43.5V. On the other hand, the converter 405/9 attached to the shaded panel 401/9 will output 40 W/4.6 A=8.7V. Checking the math, the input to the inverter can be obtained by adding nine converters providing 43.5V and one converter providing 8.7V, i.e., (9×43.5V)+8.7V=400V.

The output of the nine non-shaded panels would still be controlled by the MPPT as in FIG. 4A, thereby standing at 32V and 6.25 A. On the other hand, since the nines panel 401/9 may be shaded, lets assume its MPPT dropped to 28V. Consequently, the output current of the ninth panel is 40 W/28V=1.43 A. As can be seen by this example, all of the panels may be operated at their maximum power point, regardless of operating conditions. As shown by the example of FIG. 4B, even if the output of one DC source drops dramatically, the system still maintains relatively high power output by fixing the voltage input to the inverter, and controlling the input to the converters independently so as to draw power from the DC source at the MPP.

As can be appreciated, the benefit of the topology illustrated in FIGS. 4A and 4B may be numerous. For example, the output characteristics of the serially connected DC sources, such as solar panels, need not match. Consequently, the serial string may utilize panels from different manufacturers or panels installed on different parts of the roofs (i.e., at different spatial orientation). Moreover, if several strings are connected in parallel, it may be not necessary that the strings match; rather each string may have different panels or different number of panels. This topology also enhances reliability by alleviating the hot spot problem. That may be, as shown in FIG. 4A the output of the shaded panel 401/9 is 1.43 A, while the current at the output of the unshaded panels is 6.25 A. This discrepancy in current when the components are series connected may cause a large current being forced through the shaded panel that may cause overheating and malfunction at this component. However, by th use of this topology, where the input voltage may be set independently, and the power draw from each panel to its converter may be set independently according to the panels MPP at each point in time, the current at each panel may be independent on the current draw from the serially connected converters.

It may be easily realized that since the power may be optimized independently for each panel, panels could be installed in different facets and directions in BIPV installations. Thus, the problem of low power utilization in building-integrated installations may be solved, and more installations may now be profitable.

The described system may also solve the problem of energy harvesting in low light conditions. Even small amounts of light may be enough to make the converters 405 operational, and they then start transferring power to the inverter. If small amounts of power are available, there may be a low current flow—but the voltage may be high enough for the inverter to function, and the power may indeed be harvested.

According to aspects of the invention, the inverter 404 includes a control loop 420 to maintain an optimal voltage at the input of inverter 404. In the example of FIG. 4B, the input voltage to inverter 404 may be maintained at 400V by the control loop 420. The converters 405 may be transferring substantially all of the available power from the solar panels to the input of the inverter 404. As a result, the input current to the inverter 404 may be dependent only on the power provided by the solar panels and the regulated set, i.e., constant, voltage at the inverter input.

The conventional inverter 104, shown in FIG. 1 and FIG. 3A, may be required to have a very wide input voltage to accommodate for changing conditions, for example a change in luminance, temperature and aging of the solar array. This may be in contrast to the inverter 404 that may be designed according to aspects of the present invention. The inverter 404 does not require a wide input voltage and may be therefore simpler to design and more reliable. This higher reliability may be achieved, among other factors, by the fact that there may be no voltage spikes at the input to the inverter and thus the components of the inverter experience lower electrical stress and may last longer.

When the inverter 404 may be a part of the circuit, the power from the panels may be transferred to a load that may be connected to the inverter. To enable the inverter 404 to work at its optimal input voltage, any excess power produced by the solar array, and not used by the load, may be dissipated. Excess power may be handled by selling the excess power to the utility company if such an option may be available. For off-grid solar arrays, the excess power may be stored in batteries. Yet another option may be to connect a number of adjacent houses together to form a micro-grid and to allow load-balancing of power between the houses. If the excess power available from the solar array may be not stored or sold, then another mechanism may be provided to dissipate excess power.

Figure 4C:
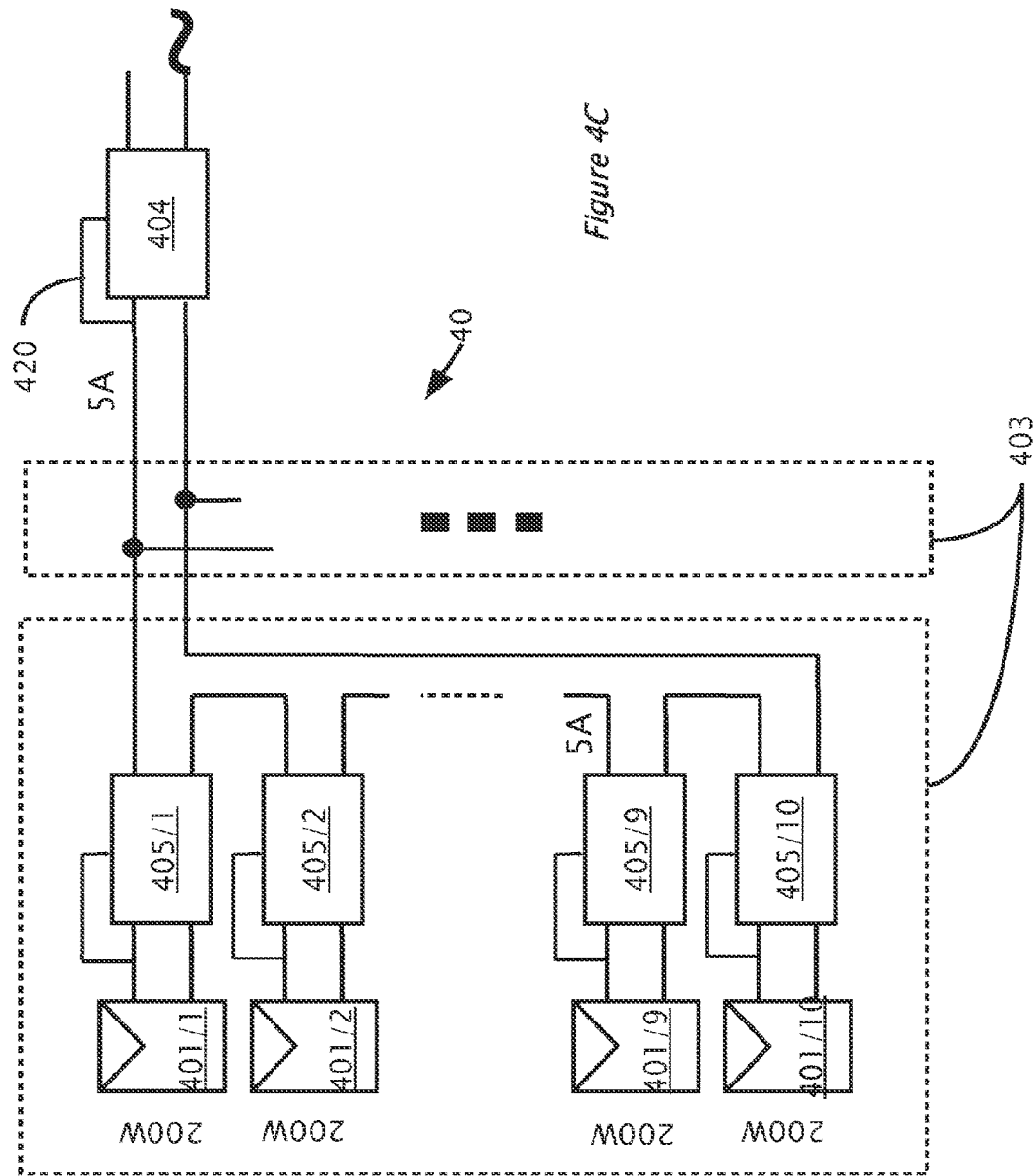
FIG. 4C illustrates a feature of the invention wherein the inverter controls the input current.

The features and benefits explained with respect to FIGS. 4A and 4B may stem, at least partially, from having the inverter to dictate the voltage provided at its input. Conversely, a design can be implemented wherein the inverter dictates the current at its input. Such an arrangement may be illustrated in FIG. 4C. FIG. 4C illustrates a feature of the invention where the inverter controls the input current. Power output of each solar panel 401 may be maintained at the maximum power point for the panel by a control loop within the corresponding power converter 405. In the example shown in FIG. 4C, all of the panels may be exposed to full sun illumination and each solar panel 401 provides 200 W of power. Consequently, the MPPT loop may draw current and voltage level that may transfer the entire 200 W from the panel to its associated converter. That may be, the current and voltage dictated by the MPPT form the input current $I_{in}$ and input voltage $V_{in}$ to the converter. The output voltage may be dictated by the constant current set at the inverter 404, as will be explained below. The output voltage $V_{out}$ would then be the total power, i.e., 200 W, divided by the output current $I_{out}$.

As noted above, according to a feature of the invention, the input current to inverter 404 may be dictated by the inverter by way of control loop 420. For the purpose of this example, assume the input current may be kept as 5 A. Since we assume that there may be ten serially connected power converters, each providing 200 W, we can see that the input voltage to the inverter 404 is 2000 W/5 A=400V. Thus, the current flowing through each of the converters 401/1-401/10 must be 5 A. This means that in this idealized example each of the converters provides an output voltage of 200 W/5 A=40V. Now, assume that the MPPT for each panel (assuming perfect matching panels) dictates $V_{MPP}$=32V. This means that the input voltage to the inverter would be 32V, and the input current would be 200 W/32V=6.25 A.

Consequently, similar advantages have been achieved by having the inverter control the current, rather than the voltage. However, unlike the conventional art, changes in the output of the panels may not cause changes in the current flowing to the inverter, as that may be dictated by the inverter itself. Therefore, if the inverter may be designed to keep the current or the voltage constant, then regardless of the operation of the panels, the current or voltage to the inverter may remain constant.

Figure 5:
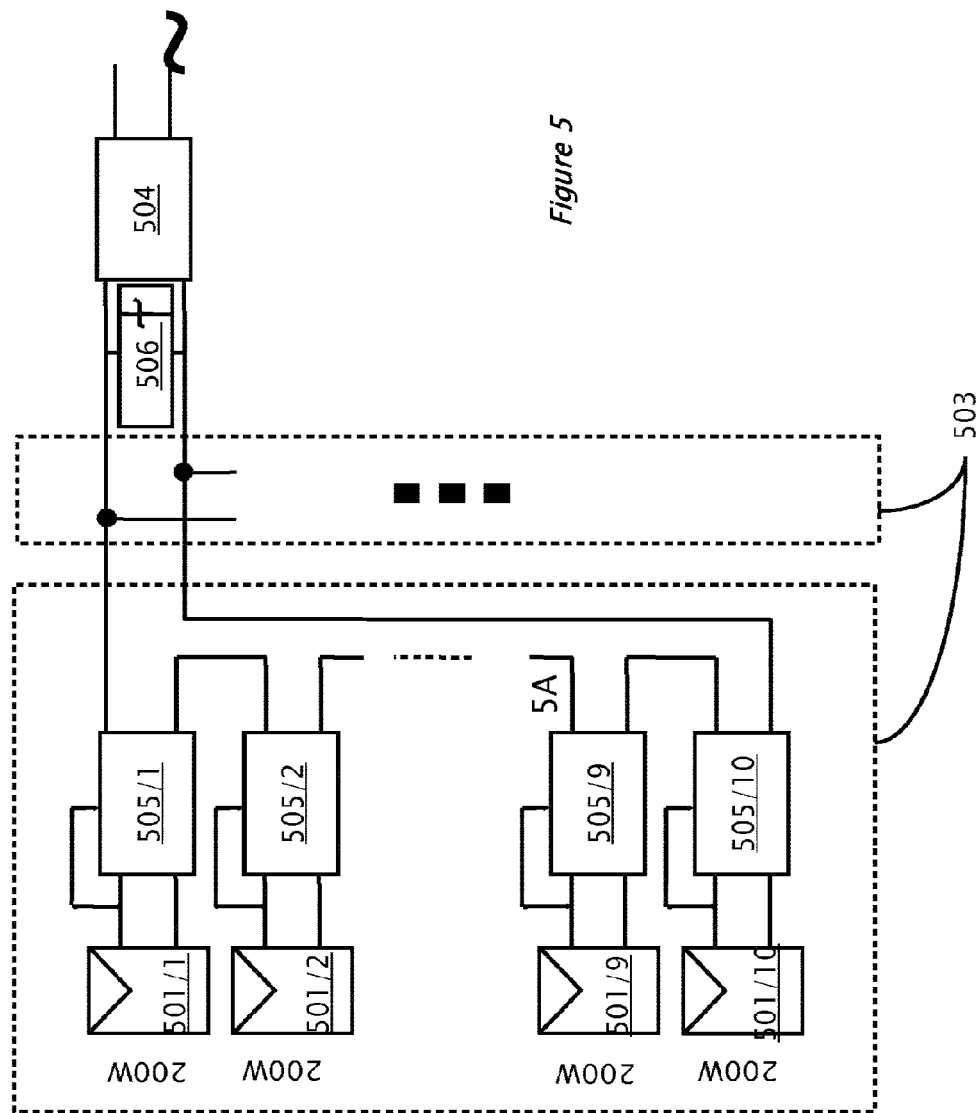
FIG. 5 illustrates a distributed power harvesting system, according to other aspects of the invention, using DC power sources.

FIG. 5 illustrates a distributed power harvesting system, according to other aspects of the invention, using DC power sources. FIG. 5 illustrates multiple strings 503 coupled together in parallel. Each of the strings may be a series connection of multiple modules and each of the modules includes a DC power source 501 that may be coupled to a converter 505. The DC power source may be a solar panel. The output of the parallel connection of the strings 503 may be connected, again in parallel, to a shunt regulator 506 and a load controller 504. The load controller 504 may be an inverter as with the features of FIGS. 4A and 4B. Shunt regulators automatically maintain a constant voltage across its terminals. The shunt regulator 506 may be configured to dissipate excess power to maintain the input voltage at the input to the inverter 504 at a regulated level and prevent the inverter input voltage from increasing. The current which flows through shunt regulator 506 complements the current drawn by inverter 504 in order to ensure that the input voltage of the inverter may be maintained at a constant level, for example at 400V.

By fixing the inverter input voltage, the inverter input current may be varied according to the available power draw. This current may be divided between the strings 503 of the series connected converters. When each converter includes a controller loop maintaining the converter input voltage at the maximum power point of the associated DC power source, the output power of the converter may be determined. The converter power and the converter output current together determine the converter output voltage. The converter output voltage may be used by a power conversion circuit in the converter for stepping up or stepping down the converter input voltage to obtain the converter output voltage from the input voltage as determined by the MPPT.

Figure 6:
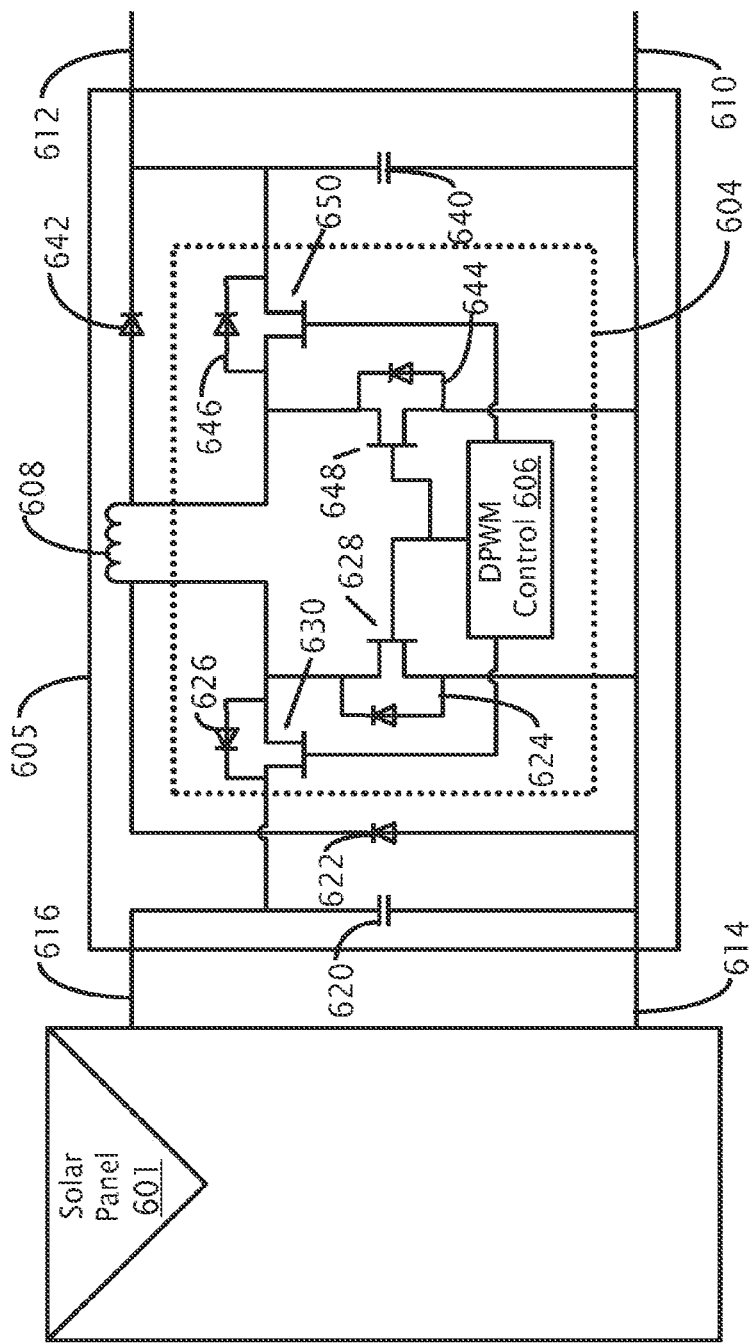
FIG. 6 illustrates an exemplary DC-to-DC converter according to aspects of the invention.

FIG. 6 illustrates an exemplary DC-to-DC converter 605 according to aspects of the invention. DC-to-DC converters may be conventionally used to either step down or step up a varied or constant DC voltage input to a higher or a lower constant voltage output, depending on the requirements of the circuit. However, in the feature of FIG. 6 the DC-DC converter may be used as a power converter, i.e., transferring the input power to output power, the input voltage varying according to the MPPT, while the output current being dictated by the constant input voltage to the inverter. That may be, the input voltage and current may vary at any time and the output voltage and current may vary at any time, depending on the operating condition of the DC power sources.

The converter 605 may be connected to a corresponding DC power source 601 at input terminals 614 and 616. The converted power of the DC power source 601 may be output to the circuit through output terminals 610, 612. Between the input terminals 614, 616 and the output terminals 610, 612, the remainder of the converter circuit may be located that includes input and output capacitors 620, 640, back flow prevention diodes 622, 642 and a power conversion circuit including a controller 606 and an inductor 608.

The inputs 616 and 614 may be separated by a capacitor 620 which acts as an open to a DC voltage. The outputs 610 and 612 may be also separated by a capacitor 640 that also acts an open to DC output voltage. These capacitors may be DC-blocking or AC-coupling capacitors that short when faced with alternating current of a frequency for which they may be selected. Capacitor 640 coupled between the outputs 610, 612 and also operates as a part of the power conversion circuit discussed below.

Diode 642 may be coupled between the outputs 610 and 612 with a polarity such that current may not backflow into the converter 605 from the positive lead of the output 612. Diode 622 may be coupled between the positive output lead 612 through inductor 608 which acts a short for DC current and the negative input lead 614 with such polarity to prevent a current from the output 612 to backflow into the solar panel 601.

The DC power sources 601 may be solar panels. A potential difference may exist between the wires 614 and 616 due to the electron-hole pairs produced in the solar cells of panel 601. The converter 605 maintains maximum power output by extracting current from the solar panel 601 at its peak power point by continuously monitoring the current and voltage provided by the panel and using a maximum power point tracking algorithm. The controller 606 may include an MPPT circuit or algorithm for performing the peak power tracking. Peak power tracking and pulse width modulation, PWM, may be performed together to achieve the desired input voltage and current. The MPPT in the controller 606 may be any conventional MPPT, such as, e.g., perturb and observe (P&O), incremental conductance, etc. However, notably the MPPT may be performed on the panel directly, i.e., at the input to the converter, rather than at the output of the converter. The generated power may be then transferred to the output terminals 610 and 612. The outputs of multiple converters 605 may be connected in series, such that the positive lead 612 of one converter 605 may be connected to the negative lead 610 of the next converter 605.

In FIG. 6, the converter 605 is shown as a buck plus boost converter. The term "buck plus boost" as used herein may be a buck converter directly followed by a boost converter as shown in FIG. 6, which may also appear in the literature as "cascaded buck-boost converter". If the voltage is to be lowered, the boost portion may be substantially shorted. If the voltage is to be raised, the buck portion may be substantially shorted. The term "buck plus boost" differs from buck/boost topology which is a classic topology that may be used when voltage may be to be raised or lowered. The efficiency of "buck/boost" topology may be inherently lower then a buck or a boost. Additionally, for given requirements, a buck-boost converter may need bigger passive components then a buck plus boost converter in order to function. Therefore, the buck plus boost topology of FIG. 6 may have a higher efficiency than the buck/boost topology. However, the circuit of FIG. 6 continuously decides whether it may be bucking or boosting. In some situations when the desired output voltage may be similar to the input voltage, then both the buck and boost portions may be operational.

The controller 606 may include a pulse width modulator, PWM, or a digital pulse width modulator, DPWM, to be used with the buck and boost converter circuits. The controller 606 may control both the buck converter and the boost converter and determines whether a buck or a boost operation may be to be performed. In some circumstances both the buck and boost portions may operate together. That may be, as explained with respect to the features of FIGS. 4A and 4B, the input voltage and current may be selected independently of the selection of output current and voltage. Moreover, the selection of either input or output values may change at any given moment depending on the operation of the DC power sources. Therefore, in the feature of FIG. 6, the converter may be constructed so that at any given time a selected value of input voltage and current may be up converted or down converted depending on the output requirement.

In one implementation, an integrated circuit (IC) 604 may be used that incorporates some of the functionality of converter 605. IC 604 may be optionally a single ASIC able to withstand harsh temperature extremes present in outdoor solar installations. ASIC 604 may be designed for a high mean time between failures (MTBF) of more than 25 years. However, a discrete solution using multiple integrated circuits may also be used in a similar manner. In the exemplary feature shown in FIG. 6, the buck plus boost portion of the converter 605 may be implemented as the IC 604. Practical considerations may lead to other segmentations of the system. For example, in one aspect of the invention, the IC 604 may include two ICs, one analog IC which handles the high currents and voltages in the system, and one simple low-voltage digital IC which includes the control logic. The analog IC may be implemented using power FETs which may alternatively be implemented in discrete components, FET drivers, A/Ds, and the like. The digital IC may form the controller 606.

In the exemplary circuit shown, the buck converter includes the input capacitor 620, transistors 628 and 630 a diode 622 positioned in parallel to transistor 628, and an inductor 608. The transistors 628, 630 each have a parasitic body diode 624, 626. In the exemplary circuit shown, the boost converter includes the inductor 608, which may be shared with the buck converter, transistors 648 and 650 a diode 642 positioned in parallel to transistor 650, and the output capacitor 640. The transistors 648, 650 each have a parasitic body diode 644, 646.

Figure 7:
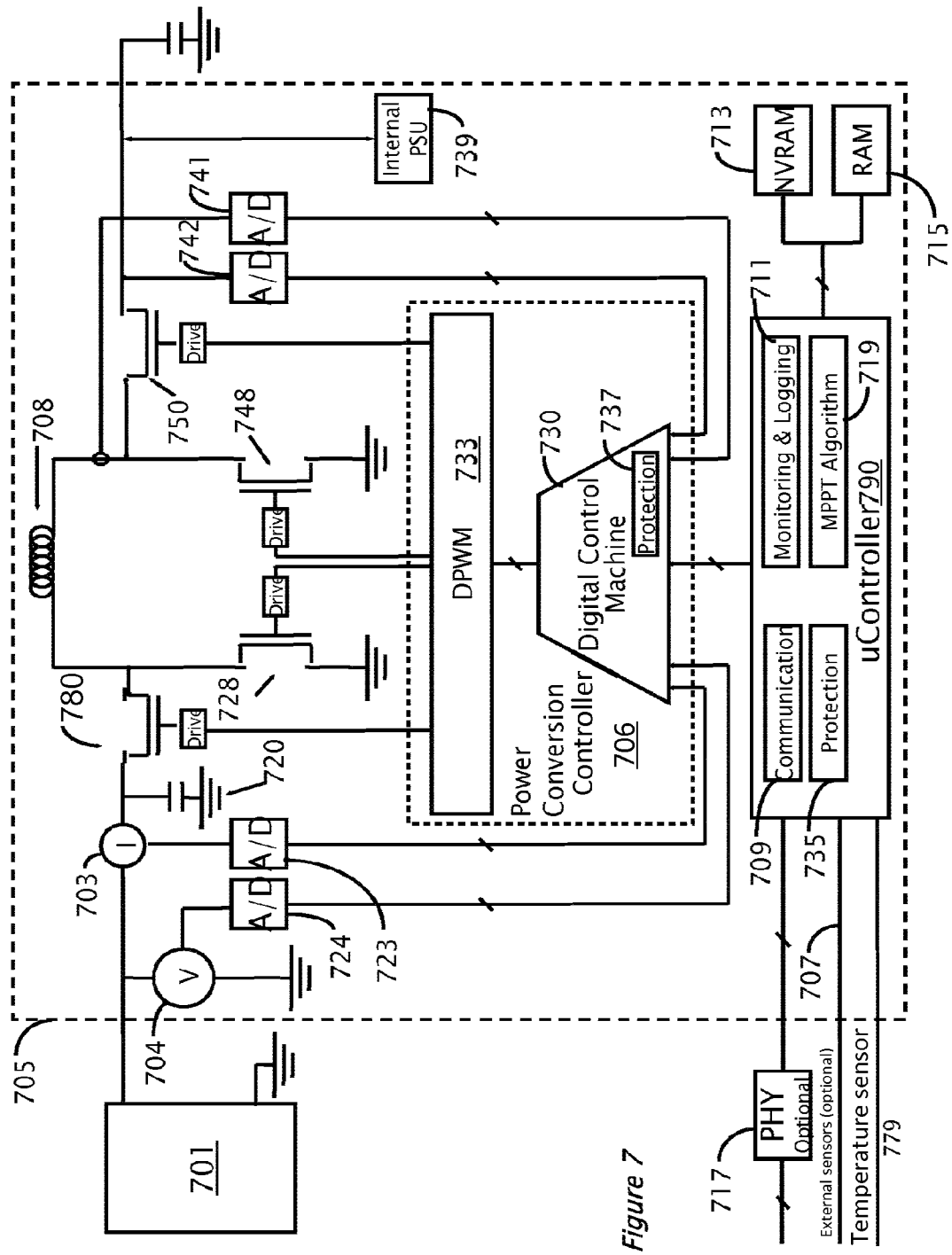
FIG. 7 illustrates a power converter, according to aspects of the invention including control features of the aspects of the invention.

FIG. 7 illustrates a power converter, according to aspects of the invention. FIG. 7 highlights, among others, a monitoring and control functionality of a DC-to-DC converter 705, according to features of the present invention. A DC voltage source 701 may be also shown in the figure. Portions of a simplified buck and boost converter circuit may be shown for the converter 705. The portions shown include the switching transistors 728, 780, 748 and 750 and the common inductor 708. Each of the switching transistors may be controlled by a power conversion controller 706.

The power conversion controller 706 includes the pulse-width modulation (PWM) circuit 733, and a digital control machine 730 including a protection portion 737. The power conversion controller 706 may be coupled to microcontroller 790, which includes an MPPT module 719, and may also optionally include a communication module 709, a monitoring and logging module 711, and a protection module 735.

A current sensor 703 may be coupled between the DC power source 701 and the converter 705, and output of the current sensor 703 may be provided to the digital control machine 730 through an associated analog to digital converter 723. A voltage sensor 704 may be coupled between the DC power source 701 and the converter 705 and output of the voltage sensor 704 may be provided to the digital control machine 730 through an associated analog to digital converter 724. The current sensor 703 and the voltage sensor 704 may be used to monitor current and voltage output from the DC power source, e.g., the solar panel 701. The measured current and voltage may be provided to the digital control machine 730 and may be used to maintain the converter input power at the maximum power point.

The PWM circuit 733 controls the switching transistors of the buck and boost portions of the converter circuit. The PWM circuit may be a digital pulse-width modulation (DPWM) circuit. Outputs of the converter 705 taken at the inductor 708 and at the switching transistor 750 may be provided to the digital control machine 730 through analog to digital converters 741, 742, so as to control the PWM circuit 733.

A random access memory (RAM) module 715 and a non-volatile random access memory (NVRAM) module 713 may be located outside the microcontroller 790 but coupled to the microcontroller 790. A temperature sensor 779 and one or more external sensor interfaces 707 may be coupled to the microcontroller 790. The temperature sensor 779 may be used to measure the temperature of the DC power source 701. A physical interface 717 may be coupled to the microcontroller 790 and used to convert data from the microcontroller into a standard communication protocol and physical layer. An internal power supply unit 739 may be included in the converter 705.

In various aspects, the current sensor 703 may be implemented by various techniques used to measure current. In one aspect of the invention, the current measurement module 703 may be implemented using a very low value resistor. The voltage across the resistor will be proportional to the current flowing through the resistor. In another aspect of the invention, the current measurement module 703 may be implemented using current probes which use the Hall Effect to measure the current through a conductor without adding a series resistor. After translating the current to voltage, the data may be passed through a low pass filter and then digitized. The analog to digital converter associated with the current sensor 703 may be shown as the A/D converter 723 in FIG. 7. Aliasing effect in the resulting digital data may be avoided by selecting an appropriate resolution and sample rate for the analog to digital converter. If the current sensing technique does not require a series connection, then the current sensor 703 may be connected to the DC power source 701 in parallel.

In one aspect, the voltage sensor 704 uses simple parallel voltage measurement techniques in order to measure the voltage output of the solar panel. The analog voltage may be passed through a low pass filter in order to minimize aliasing. The data may be then digitized using an analog to digital converter. The analog to digital converter associated with the voltage sensor 704 may be shown as the A/D converter 724 in FIG. 7. The A/D converter 724 has sufficient resolution to generate an adequately sampled digital signal from the analog voltage measured at the DC power source 701 that may be a solar panel.

The current and voltage data collected for tracking the maximum power point at the converter input may be used for monitoring purposes also. An analog to digital converter with sufficient resolution may correctly evaluate the panel voltage and current. However, to evaluate the state of the panel, even low sample rates may be sufficient. A low-pass filter makes it possible for low sample rates to be sufficient for evaluating the state of the panel. The current and voltage date may be provided to the monitoring and logging module 711 for analysis.

The temperature sensor 779 enables the system to use temperature data in the analysis process. The temperature may be indicative of some types of failures and problems. Furthermore, in the case that the power source may be a solar panel, the panel temperature may be a factor in power output production.

The one or more optional external sensor interfaces 707 enable connecting various external sensors to the converter 705. External sensors may be optionally used to enhance analysis of the state of the solar panel 701, or a string or an array formed by connecting the solar panels 701. Examples of external sensors include ambient temperature sensors, solar radiance sensors, and sensors from neighboring panels. External sensors may be integrated into the converter 705 instead of being attached externally.

In one aspect, the information acquired from the current and voltage sensors 703, 704 and the optional temperature and external sensors 705, 707 may be transmitted to a central analysis station for monitoring, control, and analysis using the communications interface 709. The central analysis station is not shown in the figure. The communication interface 709 connects a microcontroller 790 to a communication bus. The communication bus can be implemented in several ways. In one aspect, the communication bus may be implemented using an off-the-shelf communication bus such as Ethernet or RS422. Other methods such as wireless communications or power line communications, which could be implemented on the power line connecting the panels, may also be used. If bidirectional communication is used, the central analysis station may request the data collected by the microcontroller 790. Alternatively or in addition, the information acquired from sensors 703, 704, 705, 707 may be logged locally using the monitoring and logging module 711 in local memory such as the RAM 715 or the NVRAM 713.

Analysis of the information from sensors 703, 704, 705, 707 enables detection and location of many types of failures associated with power loss in solar arrays. Smart analysis can also be used to suggest corrective measures such as cleaning or replacing a specific portion of the solar array. Analysis of sensor information can also detect power losses caused by environmental conditions or installation mistakes and prevent costly and difficult solar array testing.

Consequently, in one aspect, the microcontroller 790 simultaneously maintains the maximum power point of input power to the converter 705 from the attached DC power source or solar panel 701 based on the MPPT algorithm in the MPPT module 719 and manages the process of gathering the information from sensors 703, 704, 705, 707. The collected information may be stored in the local memory 713, 715 and transmitted to an external central analysis station. In another aspect, the microcontroller 790 uses previously defined parameters stored in the NVRAM 713 in order to operate. The information stored in the NVRAM 713 may include information about the converter 705 such as serial number, the type of communication bus used, the status update rate and the ID of the central analysis station. This information may be added to the parameters collected by the sensors before transmission.

The converters 705 may be installed during the installation of the solar array or retrofitted to existing installations. In both cases, the converters 705 may be connected to a panel junction connection box or to cables connecting the panels 701. Each converter 705 may be provided with the connectors and cabling to enable easy installation and connection to solar panels 701 and panel cables.

In one aspect, the physical interface 717 may be used to convert to a standard communication protocol and physical layer so that during installation and maintenance, the converter 705 may be connected to one of various data terminals, such as a computer or PDA. Analysis may then be implemented as software which may be run on a standard computer, an embedded platform or a proprietary device.

The installation process of the converters 705 includes connecting each converter 705 to a solar panel 701. One or more of the sensors 703, 704, 705, 707 may be used to ensure that the solar panel 701 and the converter 705 may be properly coupled together. During installation, parameters such as serial number, physical location and the array connection topology may be stored in the NVRAM 713. These parameters may be used by analysis software to detect future problems in solar panels 701 and arrays.

When the DC power sources 701 may be solar panels, one of the problems facing installers of photovoltaic solar panel arrays may be safety. The solar panels 701 may be connected in series during the day when there may be sunlight. Therefore, at the final stages of installation, when several solar panels 701 may be connected in series, the voltage across a string of panels may reach dangerous levels. Voltages as high as 600V may be common in domestic installations. Thus, the installer faces a danger of electrocution. The converters 705 that may be connected to the panels 701 may use built-in functionality to prevent such a danger. For example, the converters 705 may include circuitry or hardware of software safety module that limits the output voltage to a safe level until a predetermined minimum load may be detected. Only after detecting this predetermined load, the microcontroller 790 ramps up the output voltage from the converter 705.

Another method of providing a safety mechanism may be to use communications between the converters 705 and the associated inverter for the string or array of panels. This communication, that may be for example a power line communication, may provide a handshake before any significant or potentially dangerous power level may be made available. Thus, the converters 705 would wait for an analog or digital release signal from the inverter in the associated array before transferring power to inverter.

The above methodology for monitoring, control and analysis of the DC power sources 701 may be implemented on solar panels or on strings or arrays of solar panels or for other power sources such as batteries and fuel cells.

Figure 8:
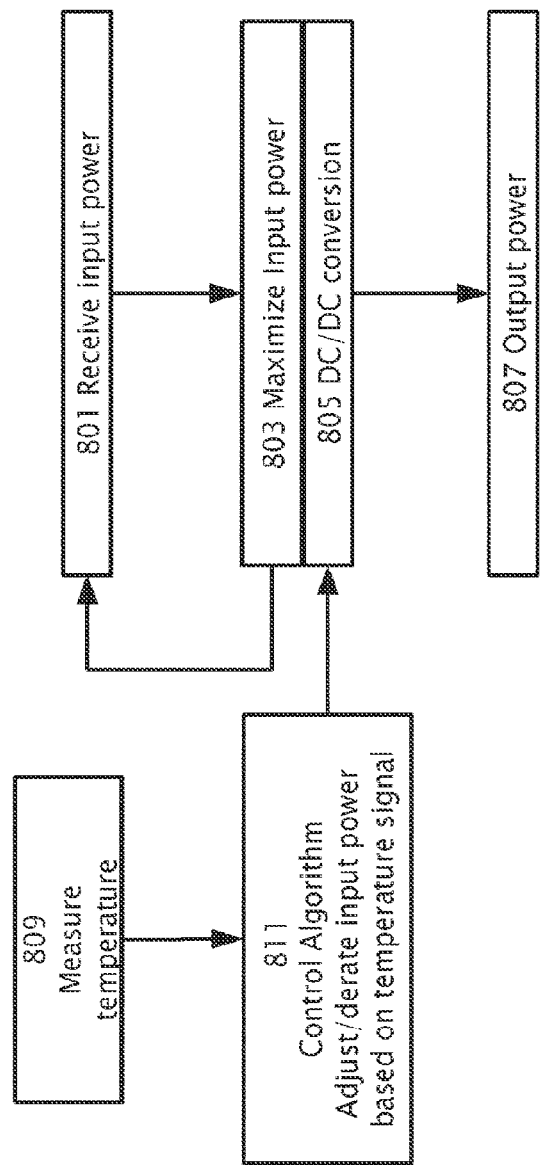
FIG. 8 illustrates a method, according to a feature of the present invention.

Reference is now made to FIG. 8, illustrating a method according to a feature of the present invention. Input power may be received (step 801) and converted (step 805) and output (step 807) as output power. A control loop maximizes (step 803) input power typically using one of the known maximum power point tracking algorithms on the received input power. Meanwhile, temperature may be measured (step 809) and based on the temperature signal input the control algorithm adjusts (step 811) the input power, i.e. reduces the input power, based on the temperature signal. The temperature derating achieves an improved reliability by reducing the temperature stress and increasing the expected lifetime of the electronic components of power converter 305, 405.

The articles "a", "an", as used hereinafter are intended to mean and be equivalent to "one or more" or "at least one", For instance, "a power converter" means "one or more power converters".

Although selected features of the present invention have been shown and described, it is to be understood the present invention is not limited to the described features. Instead, it is to be appreciated that changes may be made to these features without departing from the principles and spirit of the invention, the scope of which is defined by the claims and the equivalents thereof

The invention claimed is:

1. An apparatus including:
   a plurality of sensor interfaces configured to receive a plurality of respective sensor signals indicative of a temperature of a power converter and indicative of electrical power input to the power converter; and
   controller circuitry configured to adjust the electrical power input to the power converter based on the temperature.

2. The apparatus of claim 1, wherein the controller circuitry is configured to adjust the electrical power input to the power converter by reducing the electrical power input to the power converter based on the temperature.

3. The apparatus of claim 1, wherein the controller circuitry is configured to adjust the electrical power input to the power converter by temperature derating the electrical power input to the power converter.

4. The apparatus of claim 1, wherein the controller circuitry is configured to adjust the electrical power input to the power converter by reducing at least one of voltage and current of the electrical power input to the power converter.

5. The apparatus of claim 1, wherein the controller circuitry is configured to adjust the electrical power input to the power converter based on the electrical power being generated from one or more solar cells.

6. The apparatus of claim 1, wherein the controller circuitry is configured to adjust the electrical power input to the power converter by maximizing the electrical power input to the power converter based on the temperature.

7. The apparatus of claim 1, wherein the controller circuitry is configured to adjust the electrical power input to the power converter by maximizing the electrical power input to the power converter using a maximum power point tracking algorithm and reducing the maximized electrical power based on the temperature.

8. The apparatus of claim 1, further comprising the power converter, wherein the control circuitry further controls power conversion by the power converter.

9. A method including:
   receiving, from a plurality of sensors, a plurality of respective sensor signals indicative of a temperature of a power converter and indicative of electrical power input to the power converter; and adjusting the electrical power input to the power converter based on the temperature.

10. The method of claim 9, further comprising adjusting the electrical power input to the power converter by reducing the electrical power input to the power converter based on the temperature.

11. The method of claim 9, further comprising adjusting the electrical power input to the power converter by temperature derating the electrical power input to the power converter.

12. The method of claim 9, further comprising adjusting the electrical power input to the power converter by reducing at least one of voltage and current of the electrical power input to the power converter.

13. The method of claim 9, further comprising adjusting the electrical power input to the power converter based on the electrical power being generated from one or more solar cells.

14. The method of claim 9, further comprising adjusting the electrical power input to the power converter by maximizing the electrical power input to the power converter based on the temperature.

15. The method of claim 9, further comprising adjusting the electrical power input to the power converter by maximizing the electrical power input to the power converter using a maximum power point tracking algorithm and reducing the maximized electrical power according to a temperature derating based on the temperature.

16. The method of claim 9, further comprising controlling power conversion by the power converter.

17. The method of claim 9, further comprising:
reducing temperature stress of electronic components within the power converter by temperature derating the electrical power input to the power converter.

* * * * *

UNITED STATES PATENT AND TRADEMARK OFFICE
CERTIFICATE OF CORRECTION

| | | |
|---|---|---|
| PATENT NO. | : 8,659,188 B2 | Page 1 of 1 |
| APPLICATION NO. | : 13/743581 | |
| DATED | : February 25, 2014 | |
| INVENTOR(S) | : Meir Adest et al. | |

It is certified that error appears in the above-identified patent and that said Letters Patent is hereby corrected as shown below:

In the Specification

Column 5, Detailed Description, Line 9:
    Delete "193." and insert --103.--

Column 11, Detailed Description, Line 13:
    Delete "th" and insert --the--

Column 15, Detailed Description, Line 6:
    Delete "voltage" and insert --power--

Signed and Sealed this
Fourteenth Day of April, 2015

Michelle K. Lee
*Director of the United States Patent and Trademark Office*